United States Patent

Takemura et al.

[11] Patent Number: 6,066,433
[45] Date of Patent: May 23, 2000

[54] HIGH MOLECULAR WEIGHT SILICONE COMPOUNDS, CHEMICALLY AMPLIFIED POSITIVE RESIST COMPOSITIONS, AND PATTERNING METHOD

[75] Inventors: Katsuya Takemura; Junji Tsuchiya, both of Niigata-ken; Ichiro Kaneko, Ibaraki-ken; Toshinobu Ishihara, Niigata-ken, all of Japan

[73] Assignee: Shin-Etsu Chemical Co., Ltd., Japan

[21] Appl. No.: 09/037,023

[22] Filed: Mar. 9, 1998

[30] Foreign Application Priority Data

Mar. 10, 1997 [JP] Japan ................................. 9-072702

[51] Int. Cl.$^7$ ................................................ G03F 7/004
[52] U.S. Cl. .................. 430/270.1; 430/326; 430/330; 430/905; 528/40
[58] Field of Search .............................. 430/270.1, 905, 430/330, 326; 528/40

[56] References Cited

U.S. PATENT DOCUMENTS 5,773,192   6/1998   Murai et al. .......................... 430/270.1

FOREIGN PATENT DOCUMENTS 6-118651   4/1994   Japan .

OTHER PUBLICATIONS

JP 6118651 A (English abstract).

*Primary Examiner*—John S. Chu
*Attorney, Agent, or Firm*—Millen, White, Zelano & Branigan, P.C.

[57] ABSTRACT

In a silicone polymer having phenolic hydroxyl groups, the hydrogen atoms of some of the phenolic hydroxyl groups are replaced by acid labile groups of at least one type. The silicone polymer is crosslinked at some of the remaining phenolic hydroxyl groups with crosslinking groups having C—O—C linkages within a molecule and/or between molecules. The silicone polymer has a Mw of 5,000 to 50,000. A chemically amplified positive resist composition comprising the silicone polymer as a base resin has a high sensitivity and resolution so that it is suitable for fine patterning with electron beams or deep UV. Because of improved oxygen plasma etching resistance, the composition is suitable for use in the two-layer resist technique.

17 Claims, No Drawings

HIGH MOLECULAR WEIGHT SILICONE COMPOUNDS, CHEMICALLY AMPLIFIED POSITIVE RESIST COMPOSITIONS, AND PATTERNING METHOD

BACKGROUND OF THE INVENTION

1. Field of the Invention

This invention relates to a high molecular weight silicone compound (or silicone polymer) having acid labile groups of at least one type and crosslinked with crosslinking groups having C—O—C linkages within a molecule and/or between molecules. It also relates to a chemically amplified positive resist composition comprising the silicone polymer as a base resin which has a high sensitivity to actinic radiation, can form resist patterns by developing with aqueous base, and is thus suitable for fine patterning. It further relates to a patterning method using the composition.

2. Prior Art

As the LSI technology tends toward higher integration and higher speed, further refinement of pattern rules is required. The current patterning technology mostly relies on light exposure which is now approaching the essential limit of resolution which is dictated by the wavelength of a light source. It is generally recognized that in light exposure using g-line (wavelength 436 nm) or i-line (wavelength 365 nm) as a light source, a pattern rule of about 0.5 $\mu$m is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Since Ito et al. proposed a chemically amplified positive resist composition comprising a polyhydroxystyrene resin whose hydroxyl group is protected with a tert-butoxycarbonyloxy group (t-Boc group), known as PBOCST, and a photoacid generator in the form of an onium salt, a number of high sensitivity, high resolution resist compositions have been developed. Although these chemically amplified positive resist compositions have high sensitivity and high resolution, formation of a fine pattern having a high aspect ratio is deemed difficult when the mechanical strength of the resultant pattern is taken into account.

A number of chemically amplified positive resist compositions using polyhydroxystyrene as a base resin and having sensitivity to deep-UV, electron beams and X-rays are known in the art. These resist compositions relay on a single layer resist technique although a two-layer resist technique is advantageous in forming high aspect ratio patterns on stepped substrates. Because of such outstanding problems of substrate steps, light reflection from substrates, and difficult formation of high aspect ratio patterns, the known resist compositions are far from practical.

It is known that the two-layer resist technique is advantageous in forming high aspect ratio patterns on stepped substrates. To enable alkali development in the two-layer resist technique, silicone polymers having hydrophilic groups such as hydroxyl and carboxyl groups are required. Since the silicones having a hydroxyl group directly attached thereto, however, undergo crosslinking reaction in the presence of acid, it is difficult to apply such silanols to chemically amplified positive resist materials.

While polyhydroxybenzylsilsesquioxane is known as a stable alkali soluble silicone polymer, its derivatives obtained by protecting some hydroxyl group with t-Boc groups form chemically amplified silicone system positive resist materials when combined with photoacid generators as disclosed in Japanese Patent Application Kokai (JP-A) No. 118651/1994 and SPIE, Vol. 1952 (1993), 377.

However, when a resist composition comprising as a base a silicone polymer in the form of such a polyhydroxybenzylsilsesquioxane whose hydroxyl groups are partially protected with t-Boc groups is used to form an upper layer resist film, there arise the problems that a footing phenomenon occurs at the interface with the lower layer film, and the upper silicone resist film tends to form a difficultly soluble subsurface stratum. The footing phenomenon and the difficultly soluble subsurface stratum restrain the precise dimensional control of the pattern of the resist film, which is inadequate for fine processing.

SUMMARY OF THE INVENTION

Therefore, an object of the invention is to provide a novel and improved silicone polymer suitable as a base resin of a chemically amplified positive resist composition.

Another object of the present invention is to provide a chemically amplified positive resist composition which has a high sensitivity and resolution, is advantageously applicable to the two-layer resist technique suitable for forming high aspect ratio patterns, and can form a heat resistant pattern.

A further object of the invention is to provide a pattern forming method using the chemically amplified positive resist composition.

We have found that a novel high molecular weight silicone compound (often referred to as a silicone polymer, hereinafter) bearing phenolic hydroxyl groups in which the hydrogen atoms of some of the phenolic hydroxyl groups are replaced by acid labile groups of at least one type, which is crosslinked at some of the remaining phenolic hydroxyl groups with crosslinking groups having C—O—C linkages within a molecule and/or between molecules, and which has a weight average molecular weight of 5,000 to 50,000, preferably such a silicone polymer comprising recurring units of formula (1), more preferably formula (2), most preferably formula (3) and bearing acid labile groups and crosslinking groups is useful as a base resin. By blending this novel silicone polymer as a base resin with a photoacid generator and optionally, a dissolution regulator and a basic compound, there is obtained a chemically amplified positive resist composition which is improved in that the dissolution contrast of a resist film is increased, especially a dissolution rate after exposure is increased. Since the resist composition is improved in resolution, latitude of exposure, and process adaptability, it is well suited for practical use and advantageously used in precise fine patterning, especially in ultra-LSI manufacture.

Resist materials using as a base resin the inventive silicone polymer which is crosslinked within a molecule and/or between molecules, especially between molecules, are suitable for the two-layer resist technique because the polymer or base resin is more heat resistant due to the increased molecular weight and the elevated softening point of the polymer.

Specifically, in a first aspect, the present invention provides a high molecular weight silicone compound having phenolic hydroxyl groups. The hydrogen atoms of some of the phenolic hydroxyl groups are replaced by acid labile groups of at least one type. The silicone compound is crosslinked at some of the remaining phenolic hydroxyl groups with crosslinking groups having C—O—C linkages within a molecule and/or between molecules. The silicone compound has a weight average molecular weight of 5,000 to 50,000.

In one preferred embodiment, the high molecular weight silicone compound is comprised of recurring units of the following general formula (1), wherein the hydrogen atoms of some of the phenolic hydroxyl groups are replaced by acid labile groups, the silicone compound is crosslinked within a molecule and/or between molecules with crosslinking groups having C—O—C linkages resulting from reaction between some of the remaining phenolic hydroxyl groups and an alkenyl ether compound or halogenated alkyl ether compound, and the amount of said acid labile groups and said crosslinking groups combined is on the average more than 0 mol % to 80 mol % of the entire hydrogen atoms of phenolic hydroxyl groups.

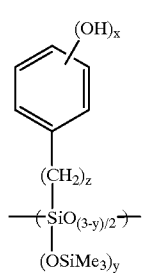

(1)

Herein, Me is a methyl group, letter x is an integer of 1 to 5, y is a positive number satisfying $0.001 \leq y \leq 0.05$, and z is an integer of 1 to 3.

In a more preferred embodiment, the high molecular weight silicone compound is comprised of recurring units of the following general formula (2), wherein the silicone compound is crosslinked within a molecule and/or between molecules with crosslinking groups having C—O—C linkages resulting from reaction of the phenolic hydroxyl groups represented by R with an alkenyl ether compound or halogenated alkyl ether compound.

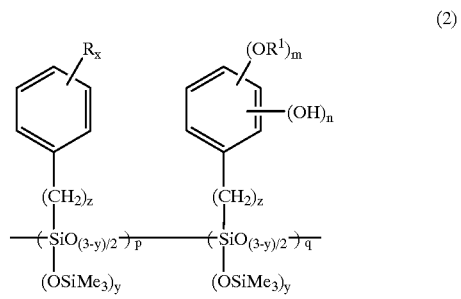

(2)

Herein, Me is a methyl group, R is a hydroxyl group or a $OR^1$ group, at least one of the R groups is a hydroxyl group, $R^1$ is an acid labile group, letter m is 0 or an integer of 1 to 5, n is an integer of 1 to 5, satisfying $m+n \leq 5$, x is an integer of 1 to 5, y is a positive number satisfying $0.001 \leq y \leq 0.05$, z is an integer of 1 to 3, p and q are positive numbers, satisfying $p+q=1$.

In a further preferred embodiment, the high molecular weight silicone compound is comprised of recurring units of the following general formula (3), wherein some hydrogen atoms are eliminated from the phenolic hydroxyl groups represented by R to leave oxygen atoms which are crosslinked with crosslinking groups having C—O—C linkages of the following general formula (4a) or (4b) within a molecule and/or between molecules.

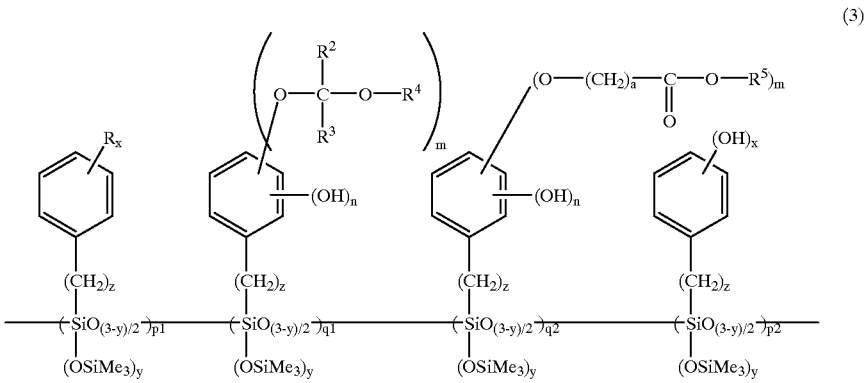

(3)

In formula (3), Me is a methyl group, R is a hydroxyl group or $OR^1$ group, at least one of the R groups is a hydroxyl group, $R^1$ is an acid labile group, each of $R^2$ and $R^3$ is hydrogen or a normal, branched or cyclic alkyl group of 1 to 8 carbon atoms, $R^4$ is a monovalent hydrocarbon group of 1 to 18 carbon atoms which may have a heteroatom, or $R^2$ and $R^3$, $R^2$ and $R^4$, or $R^3$ and $R^4$, taken together, may form a ring, with the proviso that each of $R^2$, $R^3$ and $R^4$ is a normal or branched alkylene group of 1 to 18 carbon atoms when they form a ring, $R^5$ is a tertiary alkyl group of 4 to 20 carbon atoms, a trialkylsilyl group whose alkyl groups each have 1 to 6 carbon atoms, an oxoalkyl group of 4 to 20 carbon atoms, or a group $-CR^2R^3OR^4$, letters p1 and p2 are positive numbers, q1 and q2 are 0 or positive numbers, q1 and q2 are not equal to 0 at the same time, satisfying $0<p1/(p1+p2+q1+q2) \leq 0.8$, $0 \leq q1/(p1+p2+q1+q2) \leq 0.8$, $0 \leq q2/(p1+p2+q1+q2) \leq 0.8$, and $p1+p2+q1+q2=1$, a is 0 or an integer of 1 to 6, m, n, x, y, and z are as defined above.

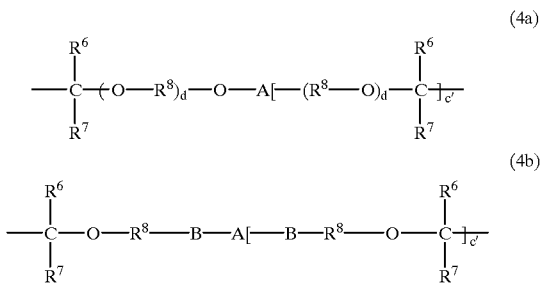

In formulae (4a) and (4b), each of $R^6$ and $R^7$ is hydrogen or a normal, branched or cyclic alkyl group of 1 to 8 carbon atoms, or $R^6$ and $R^7$, taken together, may form a range, with the proviso that each of $R^6$ and $R^7$ is a normal or branched alkylene group of 1 to 8 carbon atoms when they form a ring, $R^8$ is a normal, branched or cyclic alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, c' is an integer of 1 to 7.

Further preferably, the crosslinking group having C—O—C linkage represented by formula (4a) or (4b) is represented by the following general formula (4a') or (4b'):

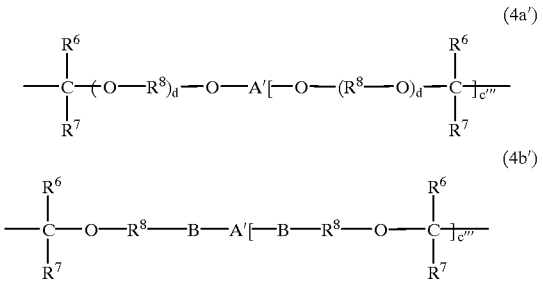

wherein each of $R^6$ and $R^7$ is hydrogen or a normal, branched or cyclic alkyl group of 1 to 8 carbon atoms, or $R^6$ and $R^7$, taken together, may form a ring, with the proviso that each of $R^6$ and $R^7$ is a normal or branched alkylene group of 1 to 8 carbon atoms when they form a range, $R^8$ is a normal, branched or cyclic alkylene group of 1 to 10 carbon atoms, letter d is 0 or an integer of 1 to 5, A' is a c''-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c'' is an integer of 2 to 4, and c''' is an integer of 1 to 3.

In a second aspect, the present invention provides a chemically amplified positive resist composition comprising
 (A) an organic solvent,
 (B) a base resin in the form of the high molecular weight silicone compound defined above, and
 (C) a photoacid generator.

The resist composition may further contain (D) a dissolution regulator, (E) a basic compound, and/or (F) another base resin. The other base resin (F) is a high molecular weight silicone compound comprising recurring units of the following general formula (1), wherein the hydrogen atoms of phenolic hydroxyl groups are replaced by acid labile groups of at least one type in an average proportion of 0 mol % to 80 mol % of the entirety, said silicone compound having a weight average molecular weight of 3,000 to 300,000.

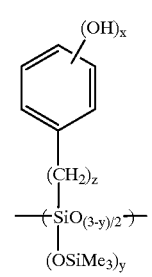

(1)

wherein Me is a methyl group, letter x is an integer of 1 to 5, y is a positive number satisfying $0.001 \leq y \leq 0.05$, and z is an integer of 1 to 3.

In a third aspect, the present invention provides a method for forming a resist pattern comprising the steps of:
 (i) applying a chemically amplified positive resist composition according to any one of claims 6 to 9 onto a substrate,
 (ii) heat treating the coated film and then exposing it to actinic radiation having a wavelength of up to 300 nm or electron beams through a photo mask, and
 (iii) optionally heat treating the exposed film and developing it with a developer.

The silicone polymer of the invention has been crosslinked within a molecule and/or between molecules with crosslinking groups having C—O—C linkages resulting from reaction of some phenolic hydroxyl groups therein with an alkenyl ether compound or halogenated alkyl ether compound. When the silicone polymer defined above is blended in a resist composition as a base resin, the advantages of a significant dissolution inhibitory effect and a greater dissolution contrast after exposure are obtained especially by virtue of the crosslinking through crosslinking groups having C—O—C linkages.

In general, in order that polysiloxanes be used as positive working resist materials, it is necessary that the polysiloxane skeleton be alkali soluble and alkali soluble functional groups be protected with acid labile protective groups. The alkali soluble polysiloxanes commercially available in a stable supply include, for example, poly(p-hydroxybenzylsilsesquioxanes) comprising units of the following formula (1).

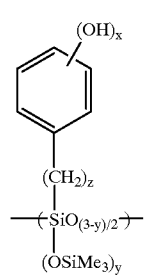

(1)

On the other hand, the acid labile protective groups for the alkali soluble functional groups, hydroxyl groups in this case, include tert-butoxycarbonyloxy groups (abbreviated as t-Boc groups). In these regards, the polysiloxanes which can be used in positive working resist materials are, for example, polysiloxanes of the following formula (5) as disclosed in JP-A 118651/1994.

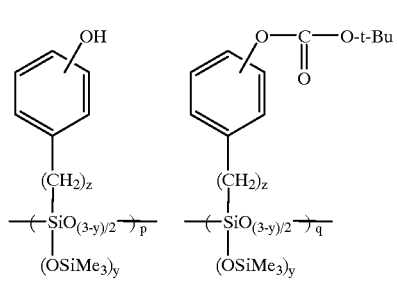

(5)

Note that t-Bu is a tert-butyl group.

The t-Boc groups used as the protective groups are deblocked by the action of an acid which generates from the photoacid generator upon exposure to actinic radiation whereby the polysiloxanes become alkali soluble and developable.

Under these circumstances, regarding a silicone resist material as applied to the two-layer resist technique, we have made investigations on the footing phenomenon at the interface between the upper layer of silicone resist material and the lower layer and the development of a difficultly soluble subsurface stratum in the upper layer. It has been ascertained by FT-IR analysis that the deblocking reaction of t-Boc groups in the resist film is accompanied with a side reaction, as shown below, which causes the footing phenomenon and the development of a difficultly soluble subsurface stratum.

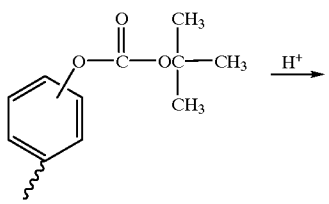

-continued

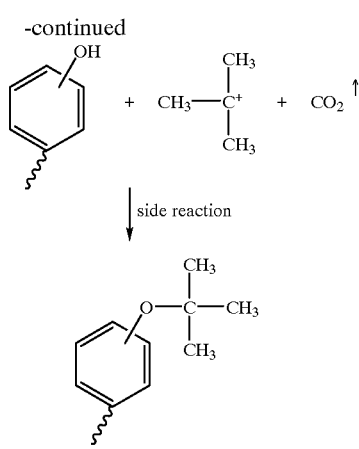

More particularly, the deblocking of t-Boc groups with acid releases tert-butyl cations which couple again with phenolic hydroxyl groups. The polymer is thus converted into the form that the phenolic hydroxyl groups are protected again, and loses the desired alkali solubility. As a result, the (upper) layer of the polymer undergoes footing at the interface with the underlying layer and develops a difficultly soluble subsurface stratum.

Among various protective groups for hydroxyl groups, the t-Boc group is one of difficult-to-deblock protective groups requiring very high activation energy for deblocking with acid (or acidolysis). Then strong acids such as trifluoromethanesulfonic acid are necessary in order to deblock t-Boc groups. If weak acids are used, they cannot promote the progress of deblocking reaction, and the resist becomes less sensitive.

In the resist film, trifluoromethanesulfonic acid generated for the coupling-off of t-BOC groups form the protective groups will diffuse into the underlying film or be deactivated by contamination form the underlying film. Since the acid concentration then lowers at the interface with the underlying layer, protective group deblocking reaction does not fully take place thereat and some areas are locally left alkali insoluble, giving rise to a footing phenomenon. At the resist film surface, on the other hand, trifluoromethanesulfonic acid will evaporate off or be deactivated by contamination from the ambient air. Since the acid concentration then lowers at the surface too, protective group deblocking reaction does not fully take place thereat and some areas are locally left alkali insoluble, forming a difficultly soluble subsurface stratum.

One solution to the problems of footing and a difficultly soluble subsurface stratum is to introduce acetal groups into phenolic hydroxyl groups. If acetal groups are singly attached to a polymer, they are sensitive enough to react with weak acid so that deblocking reaction proceeds without inducing the re-coupling reaction of once deblocked groups. Then the problems of footing and a difficultly soluble subsurface stratum do not arise.

However, for the same reason that the acetal groups are sensitive enough to react with weak acid, the resist pattern will become extremely thin with the lapse of time from exposure to heat treatment. Since the alkali dissolution inhibitory effect is low, a high substitution product must be used to insure a dissolution contrast at the sacrifice of heat resistance.

In contrast to these polymers, a silicone polymer crosslinked within a molecule and/or between molecules with crosslinking groups having C—O—C linkages as obtained by reacting some phenolic hydroxyl groups with an alkenyl ether compound or halogenated alkyl ether compound is advantageous in that a resist composition having the crosslinked polymer blended therein exhibits an alkali dissolution inhibitory effect with a limited quantity of crosslinking and improved heat resistance due to the molecular weight increased by crosslinking. Since the deblocking of crosslinking groups occurs after exposure rather than before exposure, the polymer becomes lower in molecular weight which enables enhancement of the dissolution contrast of the resist film, and eventually the resist film has a high sensitivity and resolution. Since the problems of footing and a difficultly soluble subsurface stratum are minimized, the chemically amplified positive resist composition allows the size and configuration of a resist pattern to be controlled in terms of composition, and offers improved process adaptability.

DETAILED DESCRIPTION OF THE INVENTION

Silicone Polymer

The novel silicone polymer of the invention is a high molecular weight silicone compound having phenolic hydroxyl groups, wherein the hydrogen atoms of some of the phenolic hydroxyl groups are replaced by acid labile groups of at least one type. The silicone polymer is crosslinked at some of the remaining phenolic hydroxyl groups with crosslinking groups having C—O—C linkages within a molecule and/or between molecules. The silicone polymer has a weight average molecular weight of 5,000 to 50,000.

In one preferred embodiment, the silicone polymer is comprised of recurring units of the following general formula (1). The hydrogen atoms of some of the phenolic hydroxyl groups are replaced by acid labile groups. The silicone polymer is crosslinked within a molecule and/or between molecules with crosslinking groups having C—O—C linkages resulting form reaction between some of the remaining phenolic hydroxyl groups and an alkenyl ether compound or halogenated alkyl ether compound. The amount of the acid labile groups and the crosslinking groups combines is on the average more than 0 mol % to 80 mol % of the entire hydrogen atoms of phenolic hydroxyl groups.

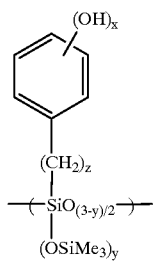

(1)

In formula (1), Me is am ethyl group, letter x is an integer of 1 to 5, y is a positive number satisfying $0.001 \leq y \leq 0.05$, and z is an integer of 1 to 3.

More particularly, the inventive polymer is a silicone polymer comprising recurring units of the following general formula (2). The silicone polymer is crosslinked within a molecule and/or between molecules with crosslinking groups having C—O—C linkages resulting from reaction of the phenolic hydroxyl groups represented by R with an alkenyl ether compound or halogenated alkyl ether compound. The amount of the acid labile groups and the crosslinking groups combined is on the average more than 0 mol to 80 mol % of the entire phenol hydroxyl groups in formula (1).

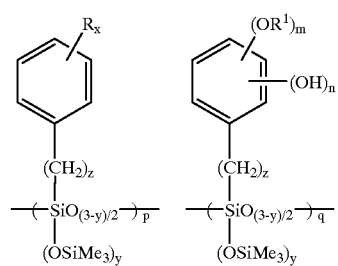

(2)

In formula (2), Me is a methyl group, R is a hydroxyl group or a $OR^1$ group, sat least one of the R groups is a hydroxyl group, $R^1$ is an acid labile group, letter m is 0 or an integer of 1 to 5, n is an integer of 1 to 5, satisfying $m+n \leq 5$, x is an integer of 1 to 5, y is a positive number satisfying $0.001 \leq y \leq 0.05$, z is an integer of 1 to 3, p and q are positive numbers, satisfying $p+q=1$.

The acid labile group which substitutes for the hydrogen atom of a phenolic hydroxyl group or which is represented by $R^1$ may be selected form a variety of acid labile groups, preferably from groups of the following formulae (6) and (7), tert-alkyl groups of 4 to 20 carbon atoms, trialkylsilyl groups whose alkyl groups each have 1 to 6 carbon atoms, and oxoalkyl groups of 4 to 20 carbon atoms.

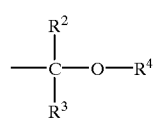

(6)

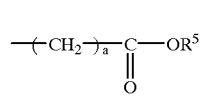

(7)

In formulae (6) and (7), $R^2$ and $R^3$ each are a hydrogen atom or normal, branched or cyclic alkyl group having 1 to 8 carbon atoms, preferably 1 to 6 carbon atoms, more preferably 1 to 5 carbon atoms. $R^4$ is a monovalent hydrocarbon group of 1 to 18 carbon atoms, preferably 1 to 10 carbon atoms, more preferably 1 to 8 carbon atoms, which may have a hetero atom such as oxygen. Alternatively, $R^2$ and $R^3$, $R^2$ and $R^4$, or $R^3$ and $R^4$, taken together, may form a ring, with the proviso that $R^2$, $R^3$ and $R^4$ each are a normal or branched alkylene group having 1 to 18 carbon atoms, preferably 1 to 10 carbon atoms, more preferably 1 to 8 carbon atoms, when they form a ring. $R^5$ is a tertiary alkyl group having 4 to 20 carbon atoms, preferably 4 to 15 carbon atoms, more preferably 4 to 10 carbon atoms, a trialkylsilyl group whose alkyl groups each have 1 to 6 carbon atoms, an oxoalkyl group of 4 to 20 carbon atoms, preferably 4 to 15 carbon atoms, more preferably 4 to 10 carbon atoms, or a group of formula (6). Letter a is 0 or a positives integer of 1 to 6.

The alkyl groups represented by $R^2$ and $R^3$ are normal, branched or cyclic alkyl groups of 1 to 8 carbon atoms, preferably 1 to 5 carbon atoms, more preferably 1 to 3 carbon atoms, for example, methyl, ethyl, propyl, isopropyl, n-butyl, isobutyl, tert-butyl, cyclohexyl and cyclopentyl.

Examples of the hydrocarbon group represented by $R^4$ include normal, branched or cyclic alkyl groups, substituted or unsubstituted aryl groups such as phenyl, p-methylphenyl, p-ethylphenyl, and alkoxyphenyl groups (e.g., p-methoxyphenyl), and aralkyl groups such as benzyl and phenethyl, as well as modified ones of these groups, for example, alkyl groups in which an oxygen atom intervenes, the hydrogen atom attached to a carbon atom is replaced by a hydroxyl group, or two hydrogen atoms are replaced by an oxygen atom to form a carbonyl group, as shown below.

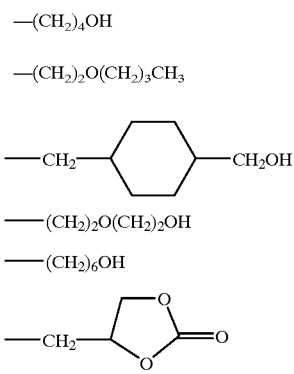

Examples of the tertiary alkyl group of 4 to 20 carbon atoms represented by $R^5$ include tert-butyl, 1-methylcyclohexyl, 2-(2-methyl)adamantyl and tert-amyl groups.

Examples of the trialkylsilyl group whose alkyl groups each have 1 to 6 carbon atoms, represented by $R^5$, include trimethylsilyl, triethylsilyl and dimethyl-tert-butylsilyl groups. Examples of the oxoalkyl group of 4 to 20 carbon atoms, represented by $R^5$, include 3-oxoalkyl and groups of the following formulae.

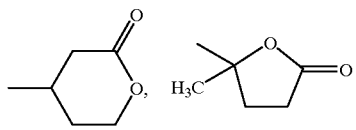

Examples of the acid labile group of formula (6) include linear or branched acetal groups such as 1-methoxyethyl, 1-ethoxyethyl, 1-n-propoxyethyl, 1-iso-propoxyethyl, 1-n-butoxyethyl, 1-iso-butoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as 2-tetrahydrofuranyl and 2-tetrahydropyranyl, with the 1-ethoxyethyl, 1-n-butoxyethyl and 1-ethoxypropyl groups being preferred. Examples of the acid labile group of formula (7) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl groups. Also included in the acid labile groups are tertiary alkyl groups having 4 to 20 carbon atoms, trialkylsilyl groups whose alkyl groups each have 1 to 6 carbon atoms, and oxoalkyl groups of 4 to 20 carbon atoms shown below.

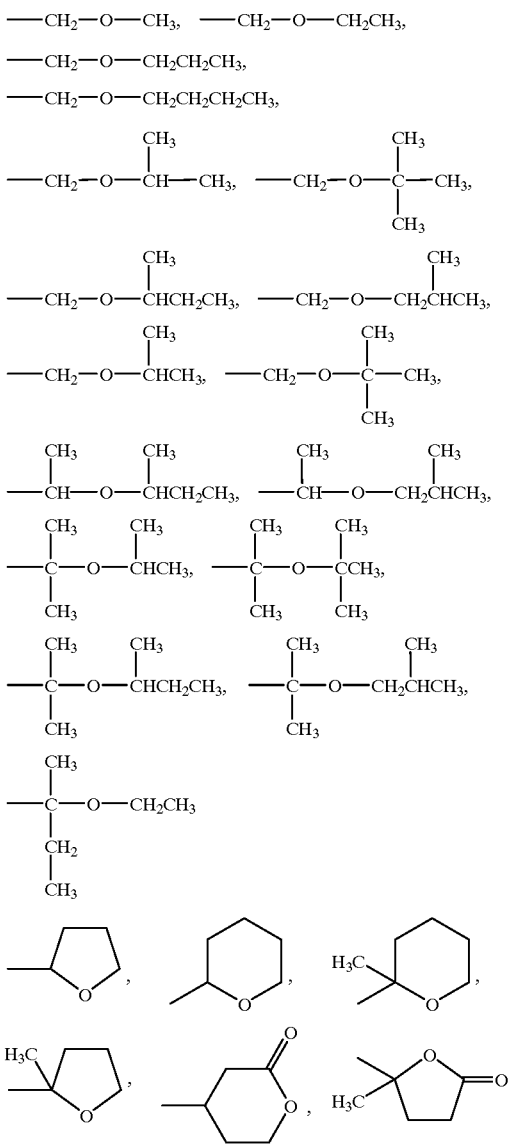

The crosslinking group having a C—O—C linkage is exemplified by groups of the following general formulae (4a) and (4b).

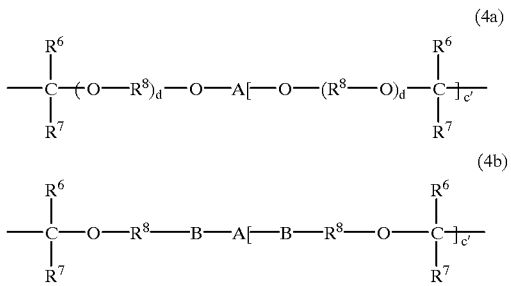

In these formulae, $R^6$ and $R^7$ each are hydrogen or a normal, branched or cyclic alkyl group of 1 to 8 carbon atoms. Alternatively, $R^6$ and $R^7$, taken together, may form a ring, with the proviso that each of $R^6$ and $R^7$ is a normal or branched alkylene group of 1 to 8 carbon atoms when they form a ring. $R^8$ is a normal, branched or cyclic alkylene group of 1 to 10 carbon atoms. Letter d is 0 or an integer of 1 to 10. A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom. B is —CO—O—, —NHCO—O— or —NHCONH—. Letter c is an integer of 2 to 8, and c' is an integer of 1 to 7.

Herein, the normal, branched or cyclic alkyl groups of 1 to 8 carbon atoms represented by $R^6$ and $R^7$ are as exemplified above. Examples of the normal, branched or cyclic alkylene groups of 1 to 10 carbon atoms represented by $R^8$ include methylene group, ethylene group, propylene group, isopropylene group, n-butylene group, isobutylene group, cyclohexylene group and cyclopentylene group. Examples of the group represented by A are described later. These crosslinking groups of formulae (4a) and (4b) originate from alkenyl ether compounds and halogenated alkyl ether compounds to be described later.

As understood from the value of c' in formula (4a) or (4b), the crosslinking group is not limited to a divalent one and trivalent to octavalent groups are acceptable. For example, the divalent crosslinking groups is exemplified by groups of the following formulae (4a") and (4b") and the trivalent crosslinking group is exemplified by groups of the following formulae (4a''') and (4b''').

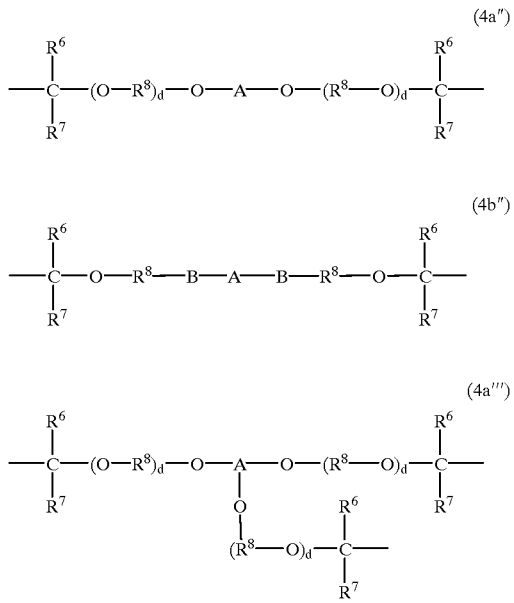

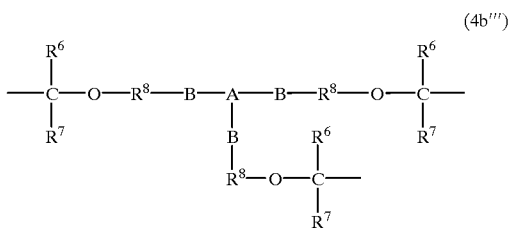

Preferred crosslinking groups are of the following formulae (4a') and (4b')

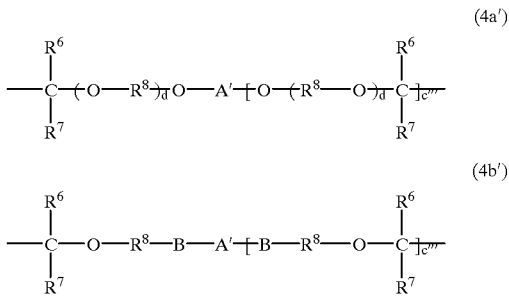

wherein $R^6$ and $R^7$ each are hydrogen or a normal, branched or cyclic alkyl group of 1 to 8 carbon atoms, or $R^6$ or $R^7$, taken together, may form a ring, with the proviso that each of $R^6$ and $R^7$ is a normal or branched alkylene group of 1 to 8 carbon atoms when they form a ring, $R^8$ is a normal, branched or cyclic alkylene group of 1 to 10 carbon atoms, letter d is 0 or an integer of 1 to 5, A' is a c"-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c" is an integer of 2 to 4, and c''' is an integer of 1 to 3.

More specifically, the silicone compound of the invention is comprised of recurring units of the following general formula (3), some hydrogen atoms being eliminated from the phenolic hydroxyl groups represented by R to leave oxygen atoms which are crosslinked with crosslinking groups having C—O—C linkages of the above general formula (4a) or (4b) within a molecule and/or between molecules. The amount of the acid labile groups and the crosslinking groups combined is on the average more than 0 mol % to 80 mol % of the entire phenol hydroxyl groups in formula (1).

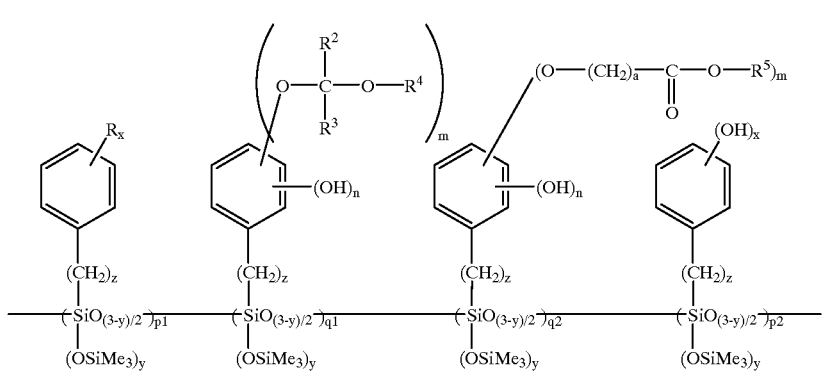

(3)

In formula (3), Me is a methyl group, R is a hydroxyl group or $OR^1$ group, at least one of the R groups is a hydroxyl group, $R^1$ is an acid labile group, each of $R^2$ and $R^3$ is hydrogen or a normal, branched or cyclic alkyl group of 1 to 8 carbon atoms, $R^4$ is a monovalent hydrocarbon group of 1 to 18 carbon atoms which may have a heteroatom, or $R^2$ and $R^3$, $R^2$ and $R^4$, or $R^3$ and $R^4$, taken together, may form a ring, with the proviso that each of $R^2$, $R^3$ and $R^4$ is a normal or branched alkylene group of 1 to 18 carbon atoms when they form a ring, $R^5$ is a tertiary alkyl group of 4 to 20 carbon atoms, a trialkylsilyl group whose alkyl groups each have 1 to 6 carbon atoms, an oxoalkyl group of 4 to 20 carbon atoms, or a group —$CR^2R^3OR^4$ letters p1 and p2 are positive numbers, q1 and q2 are 0 or positive numbers, q1 and q2 are not equal to 0 at the same time, satisfying $0<p1/(p1+p2+q1+q2)\leq 0.8$, $0\leq q1/(p1+p2+q1+q2) \leq 0.8$, $0\leq q2/(p1+p2+q1+q2)\leq 0.8$, and p1+p2+q1+q2=1, a is 0 or an integer of 1 to 6, m, n, x, y, and z are as defined above.

In formula (3), letters p1 and p2 are positive numbers, q1 and q2 are 0 or positive numbers, p1+p2=p, and q1+q2=q. Letter p1 satisfies $0<p1/(p1+p2+q1+q2)\leq 0.8$, preferably $0.02<p1/(p1+p2+q1+q2)\leq 0.4$. With too small values of p1, the crosslinking groups fail to exert their effect. Silicone polymers with too large values of p1 can gel during their preparation. Letters q1 and q2 are numbers satisfying $0\leq q1/(p1+p2+q1+q2)\leq 0.8$, $0\leq q2/(p1+p2+q1+q2)\leq 0.8$, and p1+p2+q1+q2=1, and q1 and q2 are not equal to 0 at the same time. Preferably, $0\leq q1/(p1+p2+q1+q2)\leq 0.5$ and $0\leq q2/(p1+p2+q1+q2)\leq 0.3$. Silicone polymers with too large proportions of q1 and q2 would lose alkali solubility, or allow their film to undergo thickness changes or form stresses or bubbles therein during alkali development, or sometimes lose the adhesion to the lower layer due to the reduced number of hydrophilic groups. More preferably, the sum of q1 and q2 satisfies $0<(q1+q2)/(p1+p2+q1+q2)\leq 0.3$, especially $0.05\leq (q1+q2)/(p1+p2+q1+q2)\leq 0.3$. By properly selecting the values of p1, q1 and q2 within the above-defined ranges, the size and configuration of a resist pattern can be controlled as desired.

In the silicone polymer according to the invention, the contents of the crosslinking group having a C—O—C linkage and the acid labile group having substantial influence on the dissolution rate contrast of a resist film and govern the properties of a resist composition relating to the size and configuration of a resist pattern.

Letter y in the general formulae (1), (2) and (3) is a positive number of from 0.001 to 0.05, that is, in the range; $0.001\leq y\leq 0.05$. The $(OSiMe_3)_y$ moiety is to block a terminal silanol group of a polysiloxane of formula (1), (2) or (3). If the terminal silanol group is not blocked, the resist composition lacks stability in that an undesirable increase of particles and an undesirable loss of sensitivity occur during storage.

Illustrative examples of the silicone polymer are represented by the following formulae (3'-1) and (3'-2).

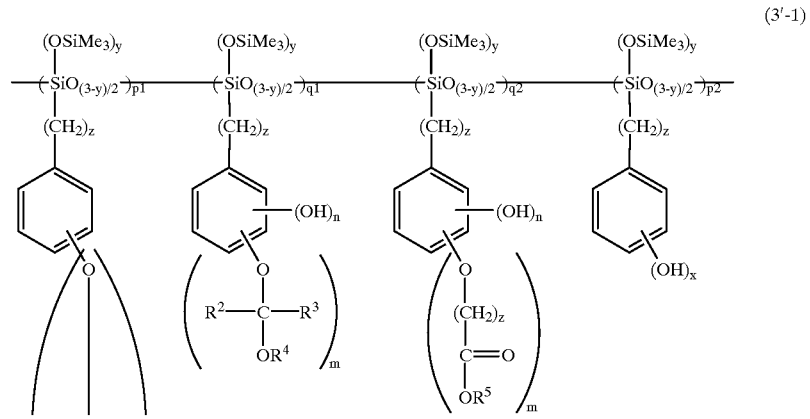

(3'-1)

-continued

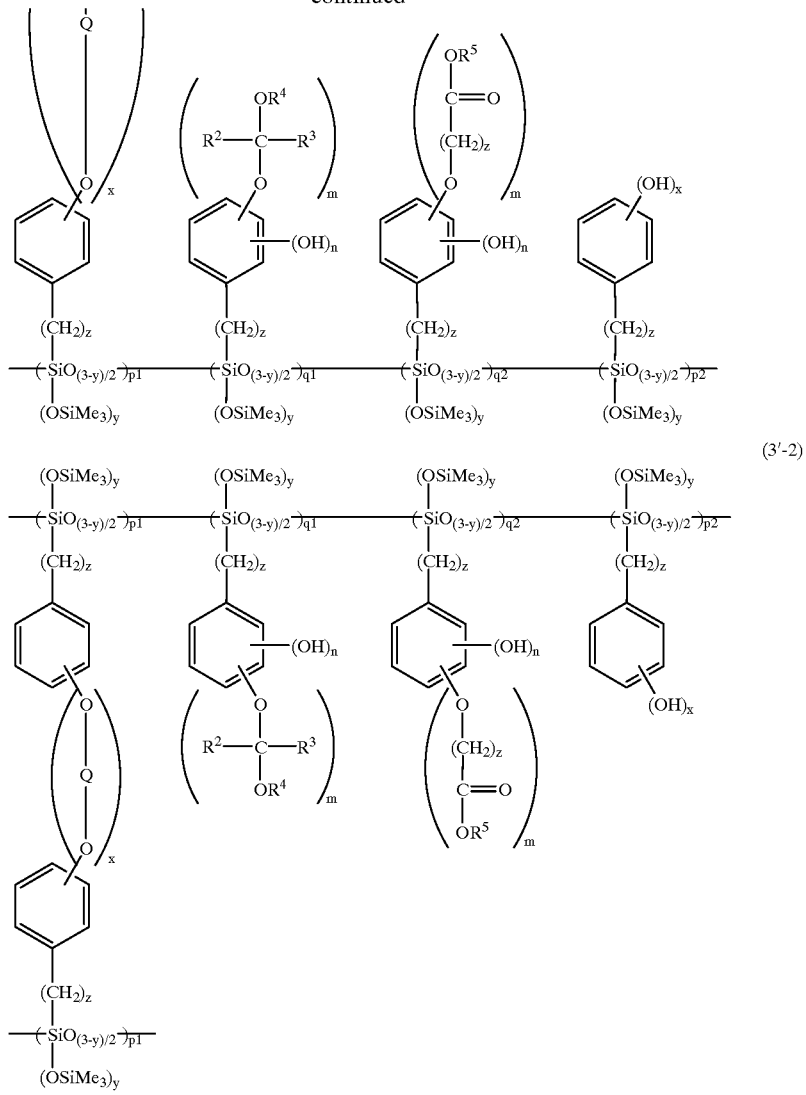

(3'-2)

It is noted that formula (3'-1) shows an intermolecular linkage and formula (3'-2) shows an intramolecular linkage. They may be present alone or in admixture.

$R^2$ to $R^5$, p1, p2, q1, q2, m, n, x, y, and z are as defined above.

Q is a crosslinking group having a C—O—C linkage, typically a crosslinking group of formula (4a) or (4b), preferably formula (4a''), (4b''), (4a''') or (4b'''), most preferably formula (4a') or (4b'). Where the crosslinking group is trivalent or more, Q is attached to at least three units of the following formulae in formula (3).

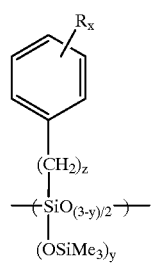

R, x, y, and z are as defined above.

In the silicone polymer of the present invention, the hydrogen atoms of some phenolic hydroxyl groups are replaced by acid labile groups and crosslinking groups having a C—O—C linkage as mentioned above. Preferably, the amount of the acid labile groups and the crosslinking groups combined is on the average from more than 0 mol % to 80 mol %, especially from 2 to 50 mol % of the entire hydrogen atoms of the phenolic hydroxyl groups in the silicone polymer of formula (1).

In this regard, the average proportion of the crosslinking group having a C—O—C linkage is from more than 0 mol % to 80 mol %, especially from 0.2 to 20 mol % of the entirety of the phenolic hydroxyl groups in formula (1). With 0 mol %, no benefits of the crosslinking group are obtained, resulting in a reduced contrast of alkali dissolution rate and low resolution. With more than 80 mol %, an overly crosslinked polymer will gel, become insoluble in alkali, induce a film thickness change, internal stresses or bubbles upon alkali development, and lose adhesion to the substrate due to less hydrophilic groups.

The average proportion of the acid labile group is from more than 0 mol % to 80 mol %, especially from 10 to 50 mol % of the entirety of the phenolic hydroxyl groups in formula (1). With 0 mol %, no benefits of the acid labile group are obtained, resulting in a reduced contrast of alkali dissolution rate and low resolution. With more than 80 mol %, alkali solubility will be lost and the affinity to an alkaline developer becomes low, resulting in low resolution.

By properly selecting the amounts of the crosslinking group having a C—O—C linkage and the acid labile group within the above-defined ranges, the size and configuration of a resist pattern can be controlled as desired. In the silicone polymer according to the invention, the contents of the crosslinking group having a C—O—C linkage and the acid labile group have substantial influence on the dissolution rate contrast of a resist film and govern the properties of a resist composition relating to the size and configuration of a resist pattern.

The silicone polymer of the invention should have a weight average molecular weight of 5,000 to 50,000, preferably 5,000 to 10,000. Polymers with a weight average molecular weight of less than 5,000 would become less resistant to plasma etching and lose the dissolution inhibitory effect in aqueous base. Polymers with a weight average molecular weight of more than 50,000 would be difficultly soluble in ordinary resist solvents.

Preparation Method

The method for preparing the silicone polymer according to the invention is now described. Exemplary methods include one method of introducing acid labile groups of formula (6) into a silicone polymer comprising recurring units of formula (1) to substitute for phenolic hydroxyl groups, isolating the polymer, and then reacting it with an alkenyl ether compound or halogenated alkyl ether compound, thereby crosslinking the polymer with crosslinking groups having C—O—C linkages within a molecule and/or between molecule; another method of reacting a silicone polymer comprising recurring units of formula (1) with an alkenyl ether compound or halogenated alkyl ether compound, thereby crosslinking the polymer with crosslinking groups having C—O—C linkages within a molecule and/or between molecule, isolating the polymer, and then introducing acid labile groups of formula (6); and a combination method of carrying out reaction with an alkenyl ether compound or halogenated alkyl ether compound and introduction of an acid labile group of formula (6) together. The combination method is preferred. It is possible to further introduce acid labile groups of formula (7), tert-alkyl, trialkylsilyl or oxoalkyl groups into the thus obtained polymer, if necessary.

More illustratively, the polymer of the invention may be prepared by either a first method using a polymer comprising recurring units of formula (1'), an alkenyl ether compound of formula (I) or (II), and a compound of formula (6a) or a second method using a polymer comprising recurring units of formula (1'), a halogenated alkyl ether compound of formula (VI) or (VII), and a compound of formula (6b).

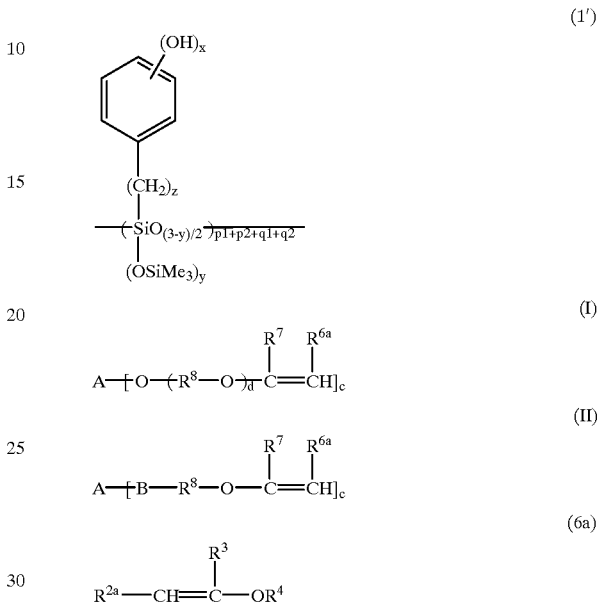

Herein, x, y, z, p1, p2, q1, and q2 are as defined above, and p1+p2+q1+q2=1.

The polysiloxane of formula (1) or (1') may be prepared by the following synthesis process. The reaction scheme is shown below.

First, p-methoxybenzylchlorosilane is subject to hydrolysis. The hydrolysis condensate is then subject to thermal condensation to form a polysiloxane comprising recurring units of formula (8). The polysiloxane (8) is trimethylsilylated for protecting the silanol groups at the ends of its backbone, obtaining a polysiloxane comprising recurring units of formula (9). This trimethylsilylation may be carried out by dissolving the polysiloxane in an organic solvent such as toluene, adding dropwise hexamethyldisilazane as the silylating agent to the solution, and allowing reaction to take place at a temperature of about 0° C. to room temperature for about 2 to 5 hours. This process has the advantage that the reaction product can be worked up by stripping off the reaction solvent under vacuum since ammonia formed as a by-product from the trimethylsilylation is not left in the reaction system. That is, the desired trimethylsilation is readily accomplished. It is also possible to achieve trimethylsilylation by dissolving the polysiloxane in an organic solvent and reacting it with trimethylsilyl chloride in the presence of a base. However, the removal of the hydrochloride salt formed is often difficult. Especially when the step of separating the hydrochloride salt by dissolving it in water is employed, hydrolysis of the trimethylsilyl group can occur so that silanol groups might be formed again in the polymer. It is thus recommended to employ the first-mentioned process using hexamethyldisilazane. By reacting the polysiloxane comprising recurring units of formula (8) with hexamethyldisilazane or trimethylsilyl chloride for the protection of silanol groups at the ends of the backbone in this way, there can be obtained a polysiloxane of formula (1) having fewer residual silanol groups.

Next, the polysiloxane (9) in which the hydrogen atom of silanol group at the end of the polysiloxane backbone has been trimethylsilylated is reacted with trimethylsilyl iodide to substitute a trimethylsilyl group for the methyl group which has protected the phenolic hydroxyl group, yielding a polysiloxane comprising recurring units of formula (10). This trimethylsilylation reaction is preferably carried out by adding dropwise trimethylsilyl iodide to the organic solvent and allowing reaction to take place at a temperature of 20 to 30° C. for 8 to 10 hours.

The product is then subject to hydrolysis for coupling off the trimethylsilyl group which has protected the phenolic hydroxyl group, thereby forming a phenolic hydroxyl group. There is obtained a polysiloxane comprising recurring units of formula (1). Hydrolysis of this stage can be carried out under well-known conditions for desilylation. For example, water is carefully added so as to avoid excessive heat release while the reactor is cooled with a water jacket to maintain a temperature of 30 to 45° C.

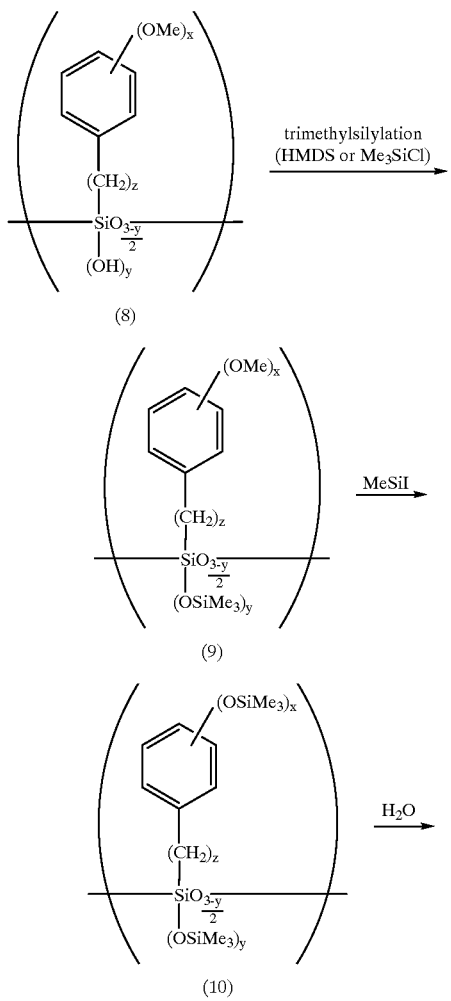

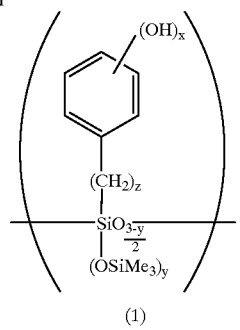

(1)

In formula (I), (II) or (6a), $R^{2a}$ is a hydrogen atom or normal, branched or cyclic alkyl group having 1 to 7 carbon atoms. $R^3$ is a hydrogen atom or normal, branched or cyclic alkyl group having 1 to 8 carbon atoms. $R^4$ is a monovalent hydrocarbon group of 1 to 18 carbon atoms which may have a hetero atom. Alternatively, $R^{2a}$ and $R^3$, $R^{2a}$ and $R^4$, or $R^3$ and $R^4$, taken together, may form a ring with the proviso that $R^{2a}$ is a normal or branched alkylene group having 1 to 7 carbon atoms and $R^3$ and $R^4$ each are a normal or branched alkylene group having 1 to 8 carbon atoms when they form a ring.

$R^{6a}$ is a hydrogen atom or normal, branched or cyclic alkyl group having 1 to 7 carbon atoms. $R^7$ is a normal, branched or cyclic alkyl group having 1 to 8 carbon atoms. Alternatively, $R^{6a}$ and $R^7$, taken together, may form a ring with the proviso that $R^{6a}$ is a normal or branched alkylene group having 1 to 7 carbon atoms and $R^7$ is a normal or branched alkylene group having 1 to 8 carbon atoms when they form a ring. $R^{11}$ is a normal or branched alkylene group having 1 to 10 carbon atoms.

In formula (I) or (II) representing the vinyl ether compound, A is a c-valent aliphatic saturated hydrocarbon, alicyclic saturated hydrocarbon, aromatic hydrocarbon or heterocyclic group having 1 to 50 carbon atoms, B is —CO—O—, —NHCO—O— or —NHCONH—, and $R^{13}$ is a normal or branched alkylene group of 1 to 10 carbon atoms. Letter c is an integer of 2 to 8, and d is 0 or an integer of 1 to 10.

The c-valent (divalent to octavalent) aliphatic or alicyclic saturated hydrocarbon and aromatic hydrocarbon groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, especially 6 to 40 carbon atoms, a combination of an alkylene group and an arylene group, and c"-valent groups obtained by eliminating one hydrogen atom attached to a carbon atom from the foregoing groups where c" is an integer of 3 to 8; and c-valent heterocyclic groups, and a combination of a heterocyclic group with any one of the foregoing hydrocarbon groups. In the alkylene groups, a hetero atom such as O, NH, N(CH$_3$), S and SO$_2$ may intervene and where substituted, the substituent is a hydroxyl, carboxyl, acyl group or fluorine atom.

The organic groups represented by A are exemplified below.

—CH$_2$CH$_2$—,    —(CH$_2$)$_3$—,    —CH—CH$_2$—,
                                            |
                                           CH$_3$

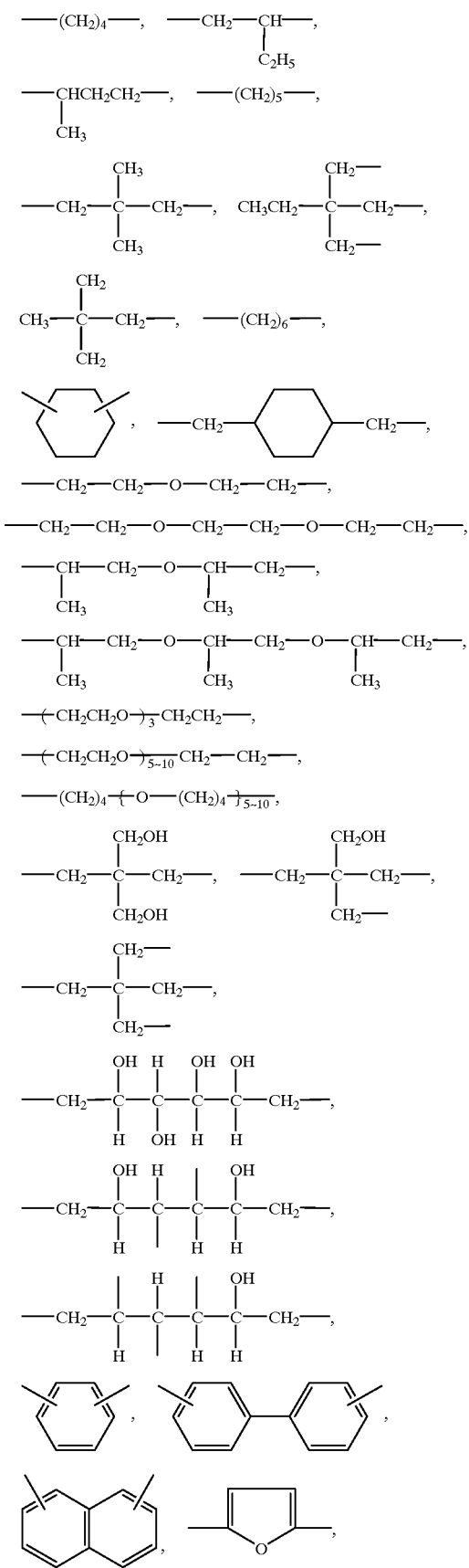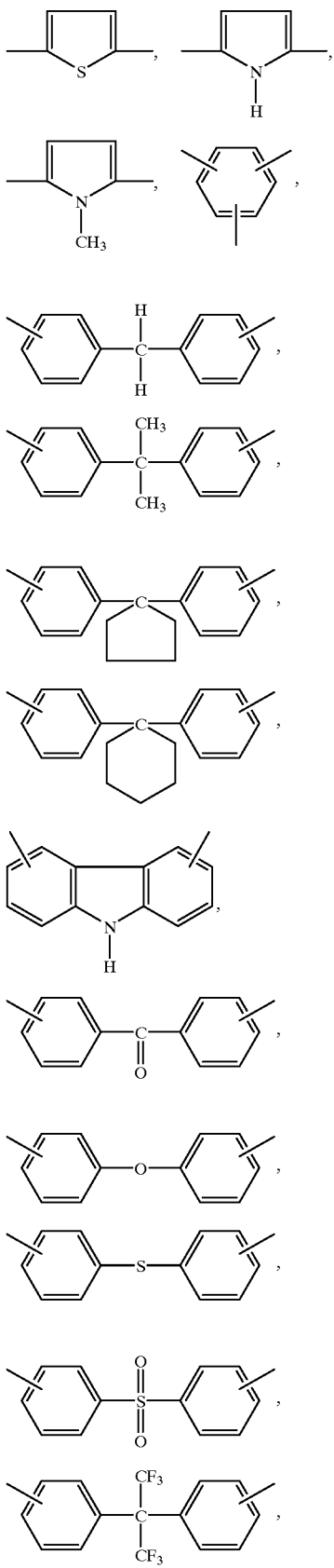

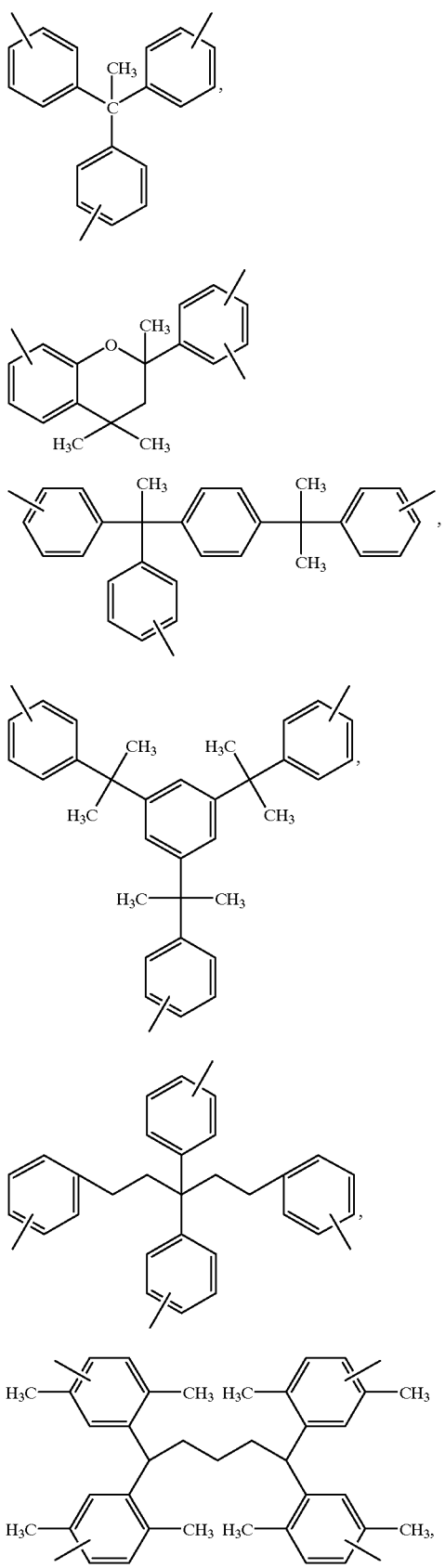
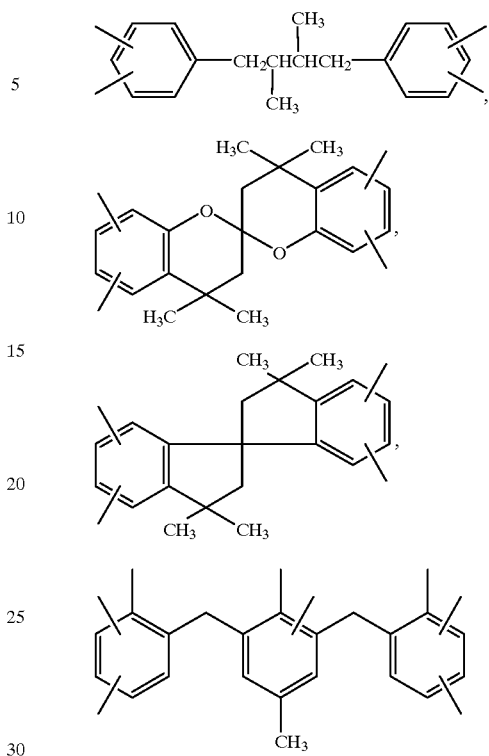

The compounds of formula (I) can be synthesized, for example, by the method described in Stephen C. Lapin, Polymers Paint Colour Journal, 179 (4237), 321 (1988), more specifically by reacting polyhydric alcohols or polyhydric phenols with acetylene or reacting polyhydric alcohols or polyhydric phenols with halogenated alkyl vinyl ethers.

Illustrative, non-limiting examples of the compound of formula (I) include ethylene glycol divinyl ether, triethylene glycol divinyl ether, 1,2-propane diol divinyl ether, 1,3-propane diol divinyl ether, 1,3-butane diol divinyl ether, 1,4-butane diol divinyl ether, tetramethylene glycol divinyl ether, neopentyl glycol divinyl ether, trimethylol propane trivinyl ether, trimethylol ethane trivinyl ether, hexane diol divinyl ether, 1,4-cyclohexane diol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylol propane triethylene vinyl ether, trimethylol propane diethylene vinyl ether, pentaerythritol diethylene vinyl ether, pentaerythritol triethylene vinyl ether, pentaerythritol tetraethylene vinyl ether as well as the compounds of the following formulae (I-1) through (I-31).

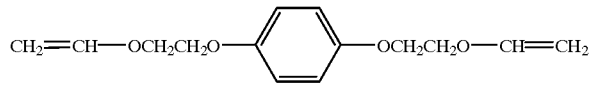
(I-1)
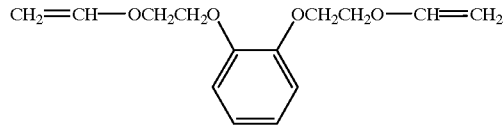
(I-2)
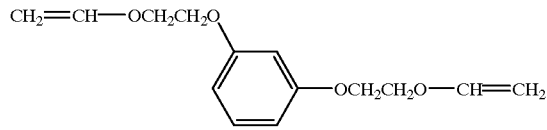
(I-3)
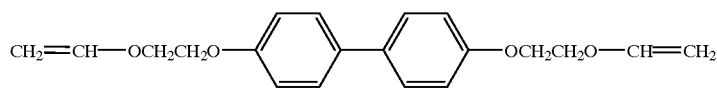
(I-4)
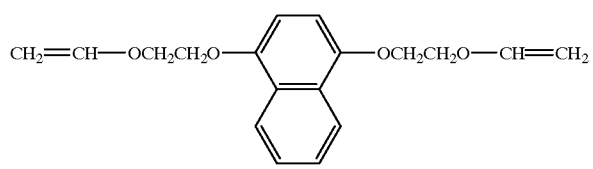
(I-5)
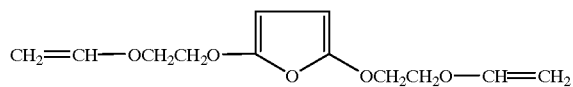
(I-6)
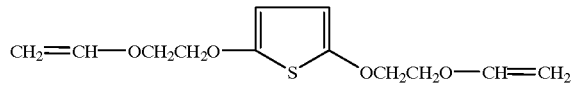
(I-7)
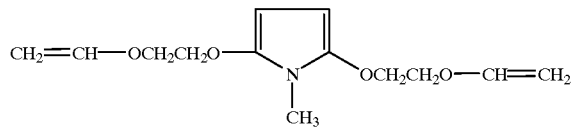
(I-8)
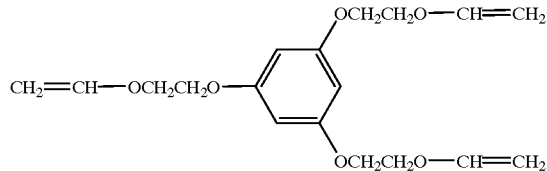
(I-9)
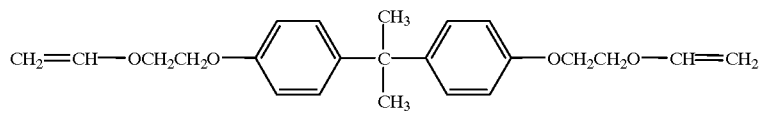
(I-10)
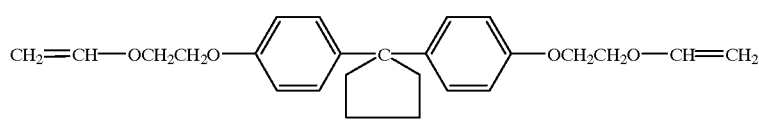
(I-11)

-continued
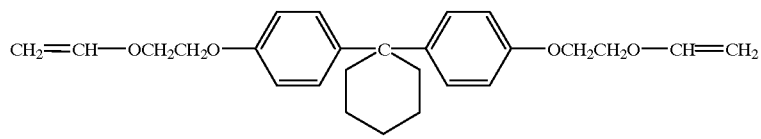
(I-12)
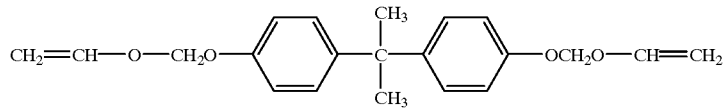
(I-13)
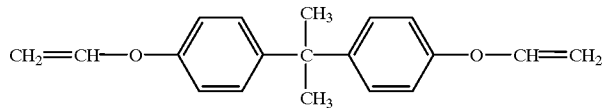
(I-14)
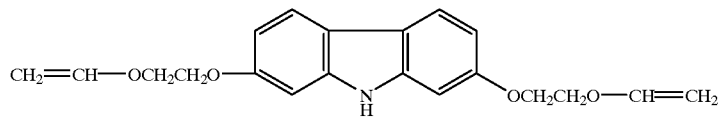
(I-15)
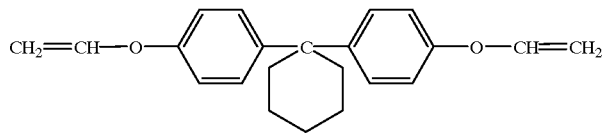
(I-16)
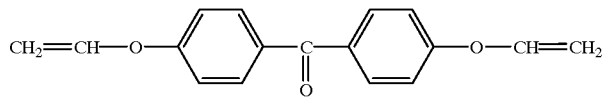
(I-17)
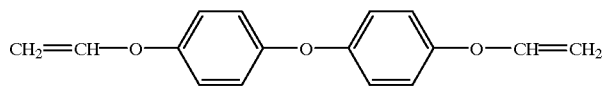
(I-18)
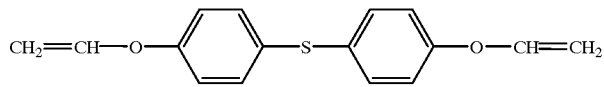
(I-19)
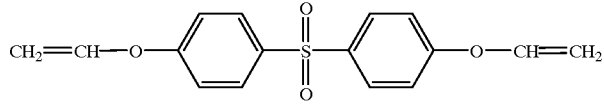
(I-20)
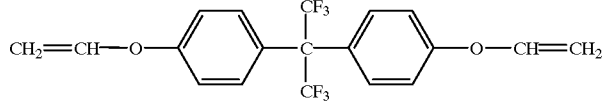
(I-21)

-continued
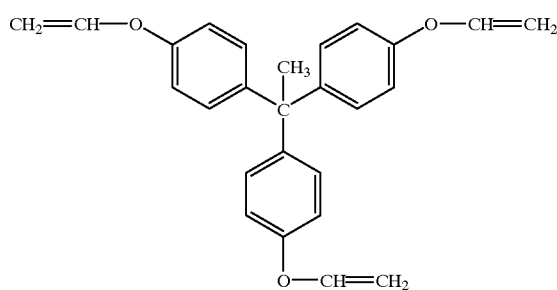
(I-22)
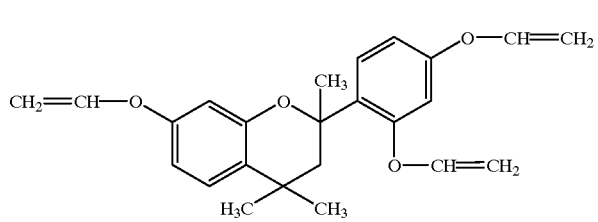
(I-23)
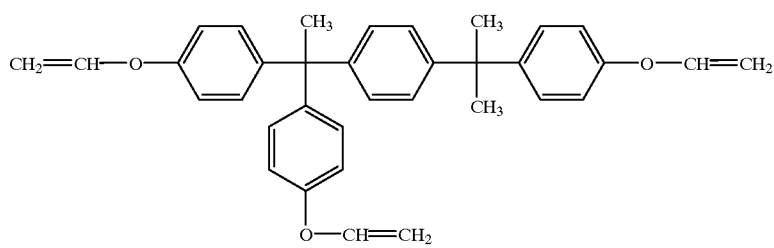
(I-24)
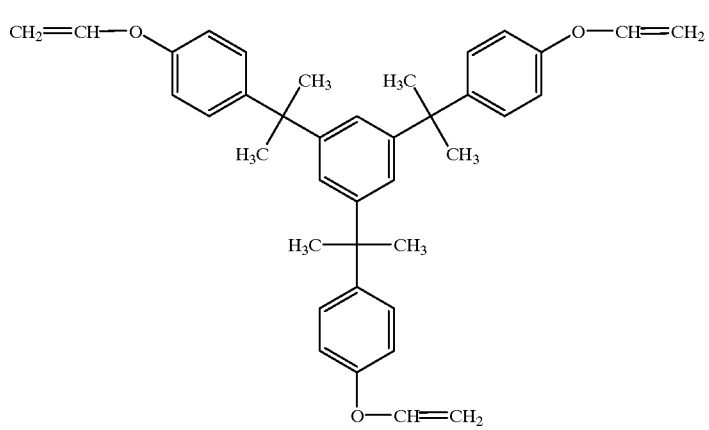
(I-25)
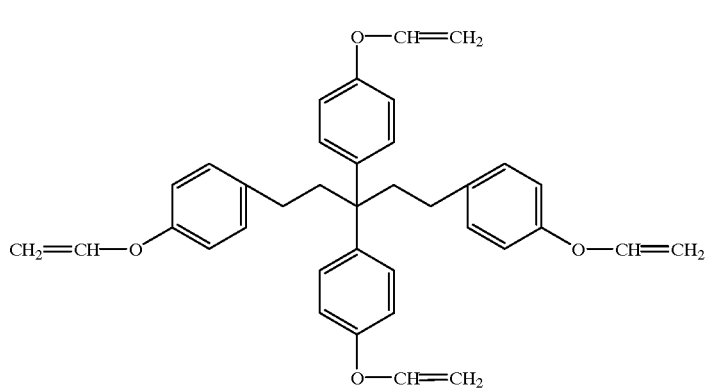
(I-26)

-continued

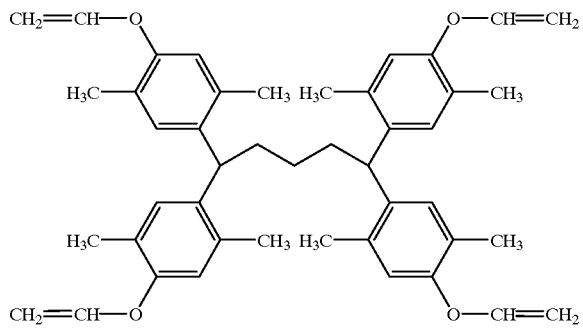 (I-27)

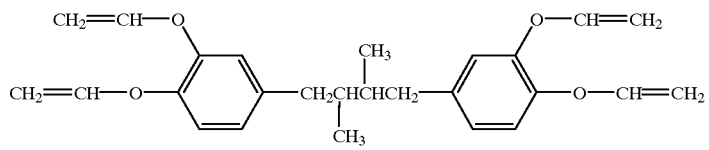 (I-28)

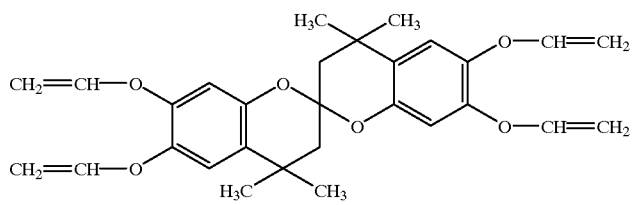 (I-29)

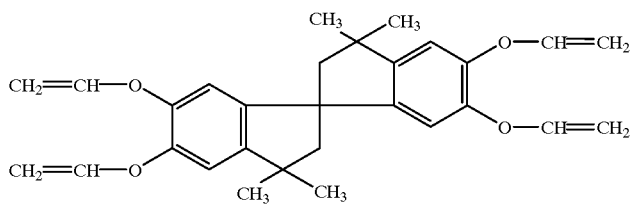 (I-30)

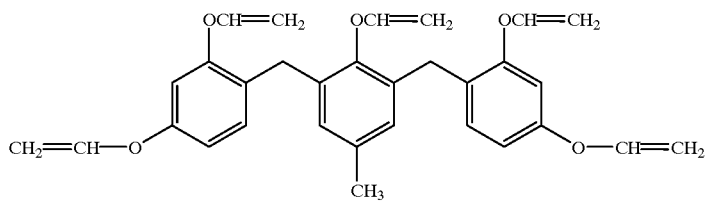 (I-31)

The compounds of formula (II) wherein B is —CO—O— can be synthesized by reacting polyfunctional carboxylic acids with halogenated alkyl vinyl ethers. Illustrative non-limiting examples include terephthalic diethylene vinyl ether, phthalic diethylene vinyl ether, isophthalic diethylene vinyl ether, phthalic dipropylene vinyl ether, terephthalic dipropylene vinyl ether, isophthalic dipropylene vinyl ether, maleic diethylene vinyl ether, fumaric diethylene vinyl ether, and itaconic diethylene vinyl ether.

Other useful alkenyl ether group-containing compounds which can be used herein are alkenyl ether group-containing compounds which are synthesized by reacting alkenyl ether compounds having active hydrogen as represented by the following formulae (III), (IV), and (V) with compounds having an isocyanato group.

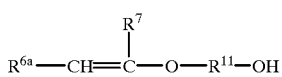 (III)

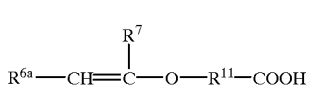 (IV)

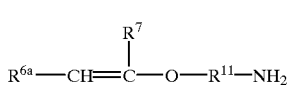 (V)

$R^{6a}$, $R^7$, and $R^{11}$ are as defined above.

The compounds having an isocyanato group of formula (II) wherein B is —NHCO—O— or —NHCONH— may be those compounds described in "Handbook of Crosslinking Agents," Taiseisha, 1981, for example. Exemplary are polyisocyanates such as triphenylmethane triisocyanate, diphenylmethane diisocyanate, tolylene diisocyanate, 2,4-tolylene diisocyanate dimer, naphthalene-1,5-diisocyanate, o-tolylene diisocyanate, polymethylene polyphenyl isocyanate, and hexamethylene diisocyanate; and polyisocyanate adducts such as an addition product of tolylene diisocyanate and trimethylolpropane, an addition product of hexamethylene diisocyanate and water, and an addition product of xylene diisocyanate and trimethylolpropane. By reacting isocyanato group-containing compounds with active hydrogen-containing alkenyl ether compounds, there are obtained various compounds are exemplified by the following formulae (II-1) through (II-11), though not limited thereto.

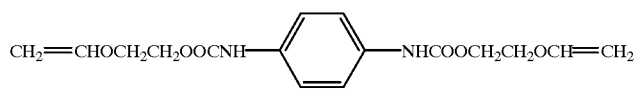
(II-1)

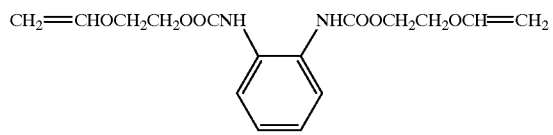
(II-2)

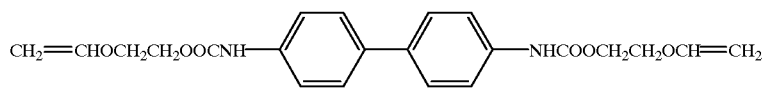
(II-3)

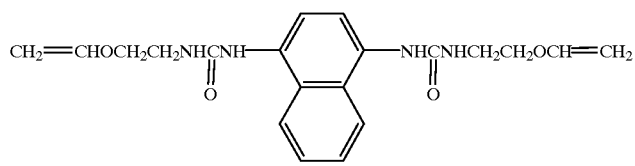
(II-4)

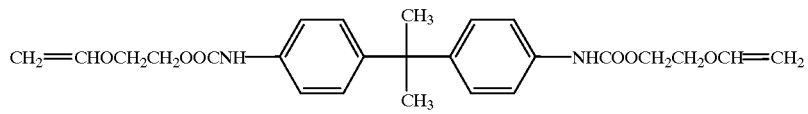
(II-5)

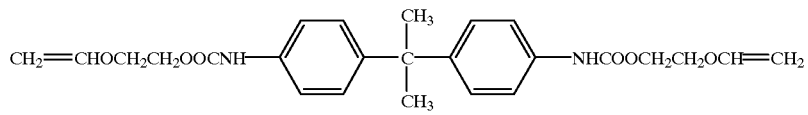
(II-6)

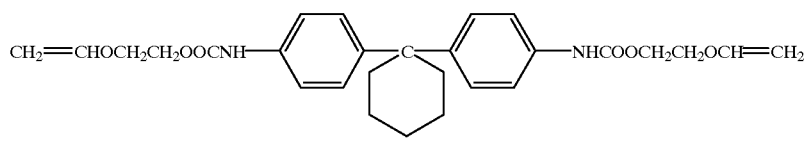
(II-7)

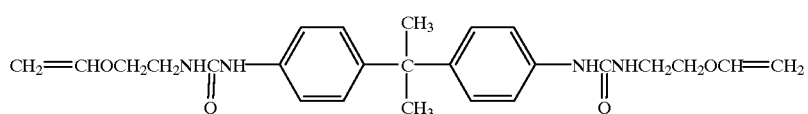
(II-8)

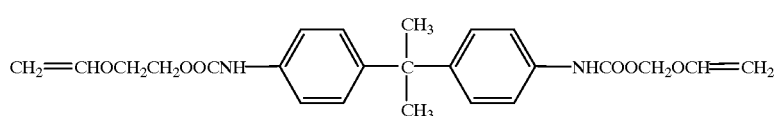
(II-9)

(II-10)

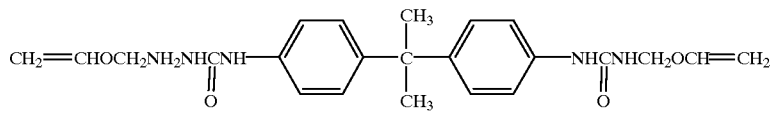

(II-11)

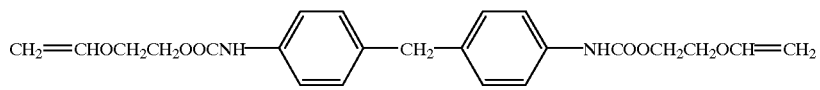

More particularly, in the first method, a silicone polymer having a weight average molecular weight of 5,000 to 50,000 and preferably represented by formula (1') is reacted with p1 mol of an alkenyl ether compound of formula (I) or (II) and q1 mol of a compound of formula (6a) per mol of the phenolic hydroxyl groups in the polymer, thereby forming a polymer having recurring units of the general formula (3a'-1) or (3a'-2).

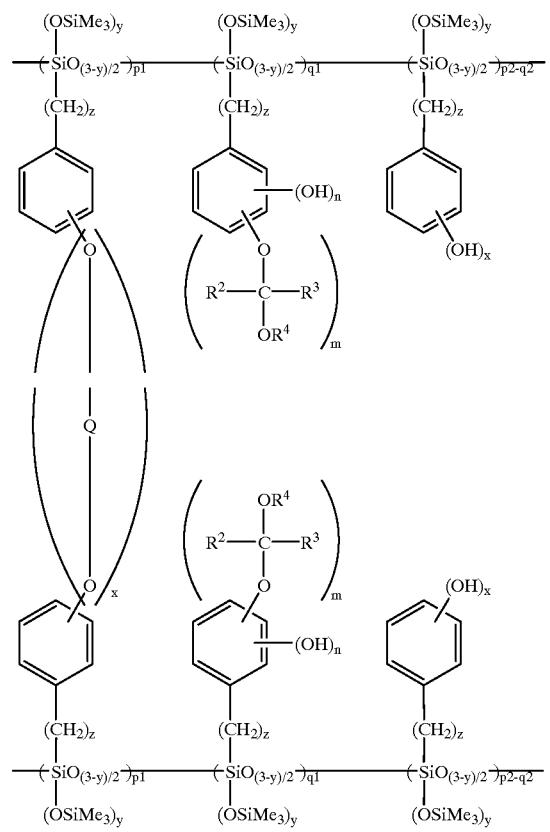

(3a'-1)

-continued

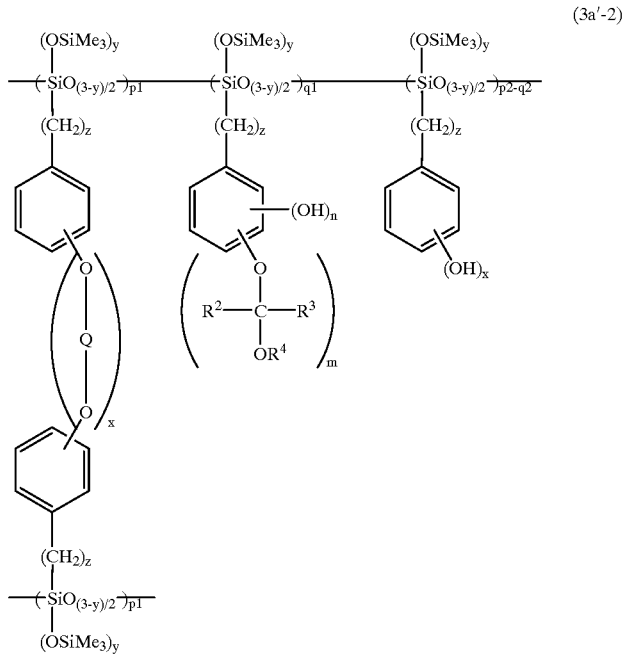

(3a'-2)

Herein, letters x, y, z, p1, p2, q1, q2, m, and n and groups $R^2$, $R^3$, $R^4$, and Q are as defined above, with the proviso: m+n=x.

In the first method, reaction is preferably carried out in a solvent in the presence of an acid catalyst. The reaction solvent used herein is preferably selected from aprotic polar solvents such as dimethylformamide, dimethylacetamide, tetrahydrofuran, and ethyl acetate, and mixtures thereof. The acid catalyst used herein is preferably selected from hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 10 mol % based on the moles of the phenolic hydroxyl group in the polymer of formula (1') to be reacted. Reaction is preferably carried out at a temperature of −20° C. to 100° C., more preferably 0° C. to 60° C. The reaction time is generally about 10 minutes to 100 hours, preferably ½ to 20 hours.

Where two types of reaction are carried out in a contiguous manner without once isolating an intermediate product, the order of addition of the alkenyl ether compound of formula (I) or (II) and the compound of formula (6a) is not critical. Preferably, the compound of formula (6a) is first added and after reaction proceeds to a full extent, the alkenyl ether compound of formula (I) or (II) is added. If the alkenyl ether compound of formula (I) or (II) and the compound of formula (6a) are simultaneously added or if the alkenyl ether compound of formula (I) or (II) is first added, then some of reactive sites of the alkenyl ether compound of formula (I) or (II) can be hydrolyzed with water in the reaction system whereby there is formed a polymer of complex structure which is difficult to control its physical properties.

Second method

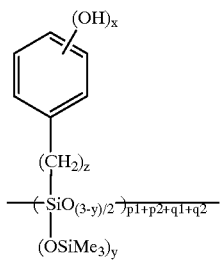

(1')

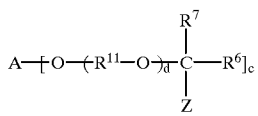

(VI)

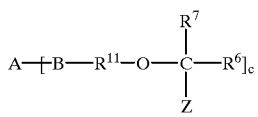

(VII)

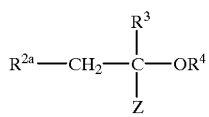

(6b)

Herein, x, y, z, p1, p2, q1, q2, $R^{2a}$, $R^3$, $R^4$, $R^6$, $R^7$, $R^{11}$, A, B, c, and d are as defined above, and Z is a halogen atom such as Cl, Br and I.

It is understood that the compounds of formulae (VI), (VII) and (6b) can be produced by reacting the compounds of formulae (I), (II) and (6a) with hydrogen chloride, hydrogen bromide or hydrogen iodide, respectively.

In the second method, a polymer having a weight average molecular weight of 5,000 to 50,000 and preferably comprising recurring units of formula (1') is reacted with p1 mol of a halogenated alkyl ether compound of formula (VI) or (VII) and q1 mol of a compound of formula (6b) per mol of the phenolic hydroxyl group in the polymer to be reacted, thereby forming a polymer having recurring units of the formula (3a'-1) or (3a'-2) shown above.

In the second method, reaction is preferably carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The base used herein is preferably selected from triethylamine, pyridine, diisopropylamine and potassium carbonate. The amount of the based used is preferably at least (p1+p2+q2) mol per mol of the phenolic hydroxyl group in the polymer of formula (1') to be reacted. Reaction is preferably carried out at a temperature of −50° C. to 100° C., more preferably 0° C. to 60° C. The reaction time is generally about ½ to 100 hours, preferably 1 to 20 hours.

It is acceptable to take a reaction sequence of first reacting a polymer having recurring units of formula (1') with a compound of formula (6a) or (6b) to form a compound of the following general formula (11), isolating the compound of formula (11), and then crosslinking the compound of formula (11) using a compound of formula (I), (II), (VI) or (VII).

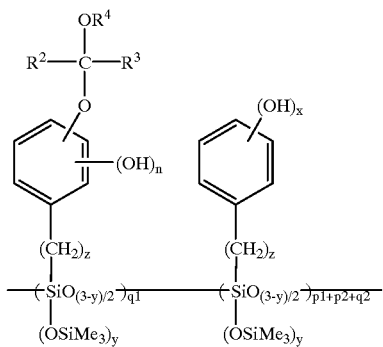

(11)

Herein, $R^2$ to $R^4$, x, y, z, m, n, p1, p2, q1 and q2 are as defined above.

Furthermore, by introducing another acid labile group into the polymers of formulae (3a'-1) and (3a'-2) obtained by the first or second method, polymers having recurring units of the following general formulae (3b'-1) and (3b'-2) can be produced if necessary. This is done by reacting the polymer of formula (3a'-1) and (3a'-2) with q2 mol of a dialkyl dicarbonate compound or alkoxycarbonylalkyl halide per mol of the phenolic hydroxyl group in the original polymer of formula (1') to introduce an acid labile group of formula (6); or by reacting the polymer of formula (3a'-1) and (3a'-2) with a tert-alkyl halide, trialkylsilyl halide or oxoalkyl compound to introduce an acid labile group.

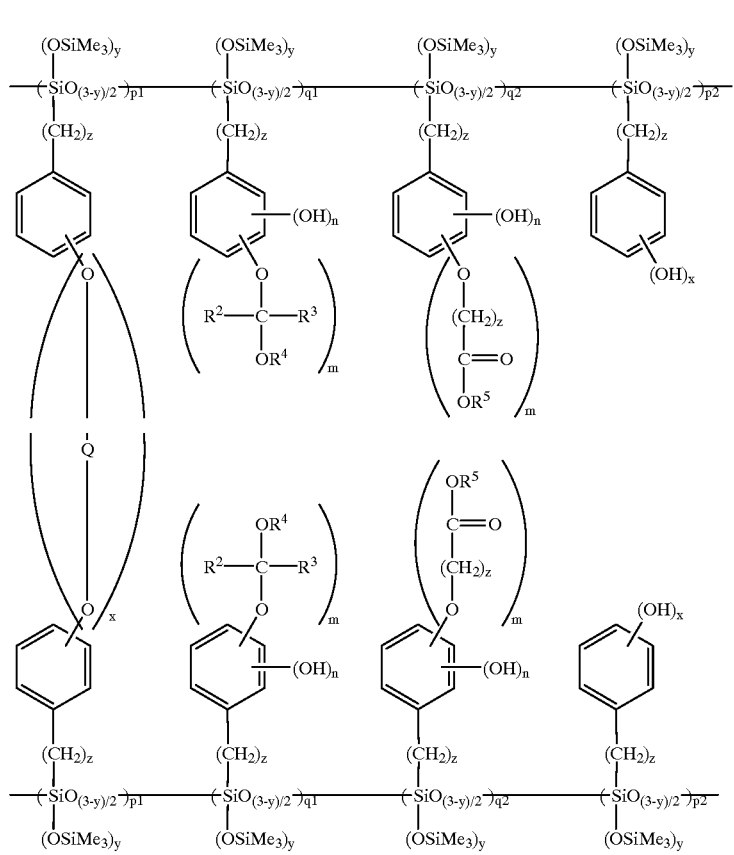

(3b'-1)

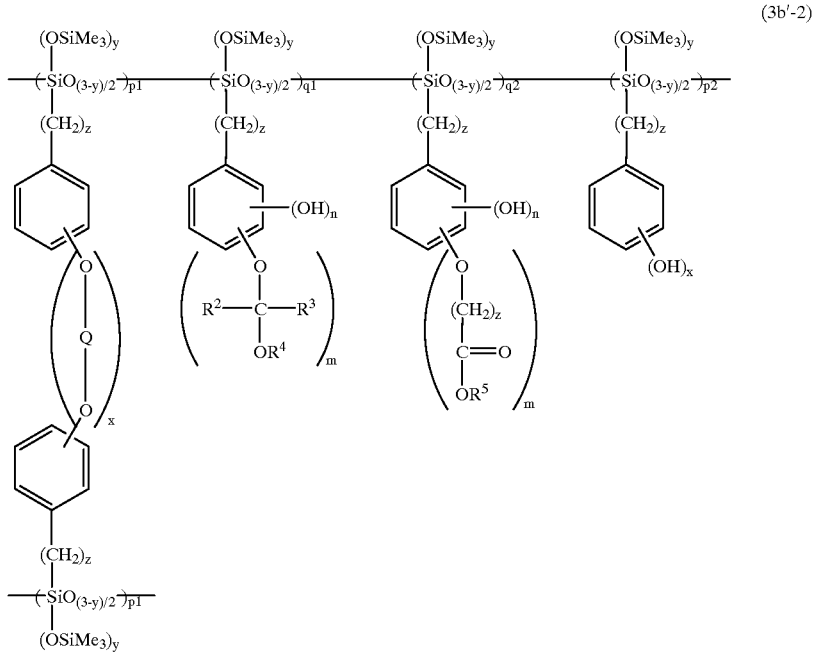

(3b'-2)

Here, $R^2$ to $R^5$, Q, x, y, z, m, n, p1, p2, q1, and q2 are as defined above.

Preferably the introduction of an acid labile group of formula (7) is carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The based used herein is preferably selected from triethylamine, pyridine, imidazole, diisopropylamine and potassium carbonate. The amount of the base used is preferably at least q2 mol per mol of the phenolic hydroxyl group in the original polymer of formula (1'). Reaction is preferably carried out at a temperature of 0° C. to 100° C., more preferably 0° C. to 60° C. The reaction time is generally about 10 minutes to 100 hours, preferably 1 to 10 hours.

Examples of the dialkyl dicarbonate compound include di-tert-butyl dicarbonate and di-tert-amyl dicarbonate. Examples of the alkoxycarbonylalkyl halide include tert-butoxycarbonylmethyl chloride, tert-amyloxylcarbonylmethyl chloride, tert-butoxycarbonylmethyl bromide, tert-butoxycarbonylethyl chloride, ethoxyethoxycarbonylmethyl chloride, ethoxyethoxycarbonylmethyl bromide, tetrahydropyranyloxycarbonylmethyl chloride, tetrahydropyranyloxycarbonylmethyl bromide, tetrahydrofuranyloxycarbonylmethyl chloride, and tetrahydrofuranyloxycarbonylmethyl bromide. Examples of the trialkylsilyl halide include trimethylsilyl chloride, triethylsilyl chloride, and dimethyl-tert-butylsilyl chloride.

Furthermore, if necessary, the polymer of formula (3a'-1) or (3a'-2) obtained by the first or second method can be tert-alkylated or oxoxalkylated by reacting the polymer with q2 mol of a tert-alkylating compound or oxoalkyl compound per mol of the phenolic hydroxyl group in the original polymer of formula (1').

Preferably this reaction is carried out in a solvent in the presence of an acid. The reaction solvent used herein is preferably selected from aprotic polar solvents such as dimethylformamide, dimethylacetamide, tetrahydrofuran, and ethyl acetate, and mixtures thereof. The acid used herein is preferably selected from hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 10 mol % based on the moles of the phenolic hydroxyl group in the original polymer of formula (1'). Reaction is preferably carried out at a temperature of −20° C. to 100° C., more preferably 0° C. to 60° C. The reaction time is generally about 10 minutes to 100 hours, preferably ½ to 20 hours.

Examples of the tert-alkylating compound include isobutene, 2-methyl-1-butene, and 2-methyl-2-butene. Examples of the oxoalkyl compound include α-angelica lactone, 2-cyclohexen-1-one, and 5,6-dihydro-2H-pyran-2-one.

Apart from the route of once forming a polymer of formula (3a'-1) or (3a'-2), it is possible to directly introduce an acid labile group of formula (7), tertiary alkyl group, trialkylsilyl group of oxoalkyl group into a polymer comprising recurring units of the following general formula (3c'-1) or (3c'-2) and optionally further introduce an acid labile group of formula (6).

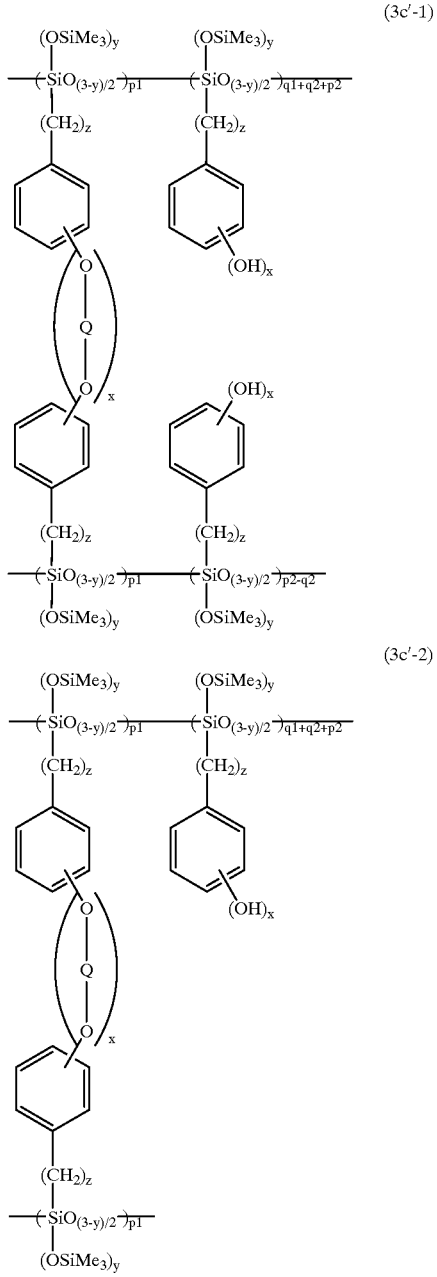

Herein, Q, x, y, z, p1, p2, q1, and q2 are as defined above.

In the polymer of the invention, the acid labile group represented by $R^1$ is not limited to one type. Acid labile groups of two or more types can be introduced into the polymer. A polymer having acid labile groups of two or more types can be obtained by first introducing q1 mol of a first acid labile group per mol of the entire hydroxyl groups in the polymer of formula (1') as above, then introducing p2 mol of a second different acid labile group by the same procedure as above, and in the case of three or more types, repeating such introduction appropriate times.

Resist

The silicone polymer of the invention is useful as a base resin of a chemically amplified positive resist composition. The present invention provides a chemically amplified positive resist composition using the above-defined polymer as a base resin. Illustratively, the resist composition contains (A) an organic solvent,
(B) a base resin in the form of the above-defined silicone polymer, and
(C) a photoacid generator.

In addition to these components, the resist composition of the invention may further contain at least one of the following components (D) to (G):
(D) a dissolution regulator,
(E) a basic compound,
(F) a base resin different from (B), and
(G) an acetylene alcohol derivative.

The organic solvent (A) used herein may be any desired one of organic solvents in which the photoacid generator, base resin, and dissolution regulator are soluble. Illustrative, non-limiting examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, diethylene glycol monomethyl ether, and diethylene glycol dimethyl ether; and ester such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate alone or in admixture of two or more. The preferred solvents are diethylene glycol dimethyl ether and 1-ethoxy-2-propanol ensuring the maximum solubility of photoacid generators and propylene glycol monomethyl ether acetate ensuring safety. These solvents may be used alone or in admixture of two or more.

The amount of the organic solvent used is preferably about 200 to 1,000 parts, more preferably about 400 to 800 parts by weight per 100 parts by weight of the base resin (B).

The photoacid generator (C) used herein is selected from onium salts of the following general formula (12), diazomethane derivatives of the following general formula (13), glyoxime derivatives of the following general formula (14), β-ketosulfone derivatives, disulfone derivatives, nitrobenzylsulfonate derivatives, sulfonate derivatives, and imidylsulfonate derivatives, for example.

$R^{30}$ is a normal, branched or cyclic alkyl group of 1 to 12 carbon atoms, aryl group of 6 to 12 carbon atoms, or aralkyl group of 7 to 12 carbon atoms; $M^+$ is iodonium or sulfonium; $K^-$ is a non-nucleophilic counter ion; and letter b is equal to 2 or 3.

Examples of the alkyl group represented by $R^{30}$ include methyl, ethyl, propyl, butyl, cyclohexyl, 2-oxocyclohexyl, norbornyl, and adamantyl. Exemplary aryl groups are phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups are benzyl and phenethyl. Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

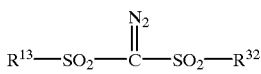

(13)

$R^{31}$ and $R^{32}$ are normal, branched or cyclic alkyl groups of 1 to 12 carbon atoms which may be halogenated, aryl groups of 6 to 12 carbon atoms which may be halogenated, or aralkyl groups of 7 to 12 carbon atoms.

Examples of the alkyl group represented by $R^{31}$ and $R^{32}$ include methyl, ethyl, propyl, butyl, amyl, cyclopentyl, cyclohexyl, norbornyl, and adamantyl. Examples of the halogenated alkyl group include trifluoromethyl, 1,1,1-trifluoroethyl, 1,1,1-trichloroethyl, and nonafluorobutyl. Examples of the aryl group include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups are fluorobenzene, chlorobenzene, and 1,2,3,4,5-pentafluorobenzene. Exemplary aralkyl groups are benzyl and phenethyl.

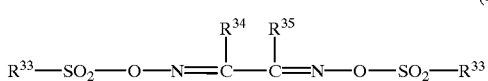

(14)

$R^{33}$, $R^{34}$ and $R^{35}$ are normal, branched or cyclic alkyl groups of 1 to 12 carbon atoms which may be halogenated, aryl groups of 6 to 12 carbon atoms which may be halogenated, or aralkyl groups of 7 to 12 carbon atoms. Alternatively, $R^{34}$ and $R^{35}$, taken together, form a cyclic structure with the proviso that $R^{34}$ and $R^{35}$ each are a normal or branched alkylene group of 1 to 6 carbon atoms when they form a cyclic structure.

Examples of the alkyl, halogenated alkyl, aryl, halogenated aryl, and aralkyl groups represented by $R^{33}$, $R^{34}$ and $R^{35}$ are the same as described for $R^{31}$ and $R^{32}$. Examples of the alkylene group represented by $R^{34}$ and $R^{35}$ include methylene, ethylene, propylene, butylene, and hexylene.

Typical examples of the photoacid generator (C) are:

onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluene-sulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl) diazomethane, bis(p-toluenesulfonyl)diazomethane, bis-(xylenesulfonyl)diazomethane, bis(cyclohexylsulfonyl) diazomethane, bis(cyclopentylsulfonyl)diazomethane, bis (n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonate ester derivatives such as 1,2,3-tris (methanesulfonyloxy)benzene, 1,2,3-tris (trifluoromethanesulfonyloxy)benzene, and 1,2,3-tris(p-toluenesulfonyloxy)benzene; and imide-yl sulfonate derivatives such as phthalimide-yl triflate, phthalimide-yl tosylate, 5-norbornene-2,3-dicarboxyimide-yl triflate, 5-norbornene-2,3-dicarboxyimide-yl tosylate, and 5-norbornene-2,3-dicarboxyimide-yl n-butylsulfonate.

Preferred among these are onium salts such as triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl) diazomethane, bis(p-toluenesulfonyl)diazomethane, bis (cyclohexylsulfonyl)diazomethane, bis(n-butylsulfonyl)

diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. It is noted that the photoacid generators mentioned above may be used alone or in admixture of two or more. The onium salts are effective for improving rectangularity while the diazomethane derivatives and glyoxime derivatives are effective for reducing standing wave. A combination of an onium salt with a diazomethane or glyoxime derivative allows for finer profile adjustment.

Desirably, the photoacid generator is added in an amount of about 0.5 to 15 parts, especially about 1 to 8 parts by weight per 100 parts by weight of the base resin. Sensitivity would be low with less than 0.5 part of the photoacid generator. More than 15 parts of the photoacid generator would lower an alkali dissolution rate to detract from resolution. Additionally heat resistance lowers because monomeric components become excessive.

The resist composition of the invention is also effective as a three component system having a dissolution regulator (D) blended therein.

The dissolution regulator (D) includes low and high molecular weight compounds which have at least one acid labile group in a molecule. Any of well-known dissolution regulators for conventional positive resist compositions may be used. The acid labile group is the same as those of formulae (6) and (7). Typical dissolution regulators are compounds obtained by substituting t-Boc groups for hydroxyl groups in bisphenol A, and compounds obtained by introducing t-Boc groups into fluoroglucine and tetrahydroxybenzophenone.

Preferably, the dissolution regulator (D) is a compound having an average molecular weight of 100 to 1,000, preferably 150 to 800 and at least two phenolic hydroxyl groups in a molecule, the hydrogen atom of the phenolic hydroxyl group being replaced by an acid labile group in an average proportion of 0% to 100% of the entire phenolic hydroxyl groups. The percent average replacement of the hydrogen atom of phenolic hydroxyl group by an acid labile group is 0 to 100 mol %, preferably 30 to 80 mol % of the entire phenolic hydroxyl groups.

The compound having at least two phenolic hydroxyl groups in a molecule as dissolution regulator (D) is exemplified by compounds of the following general formulae (i) to (xi):

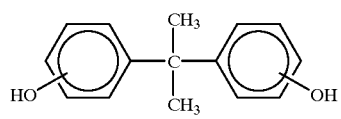

(i)

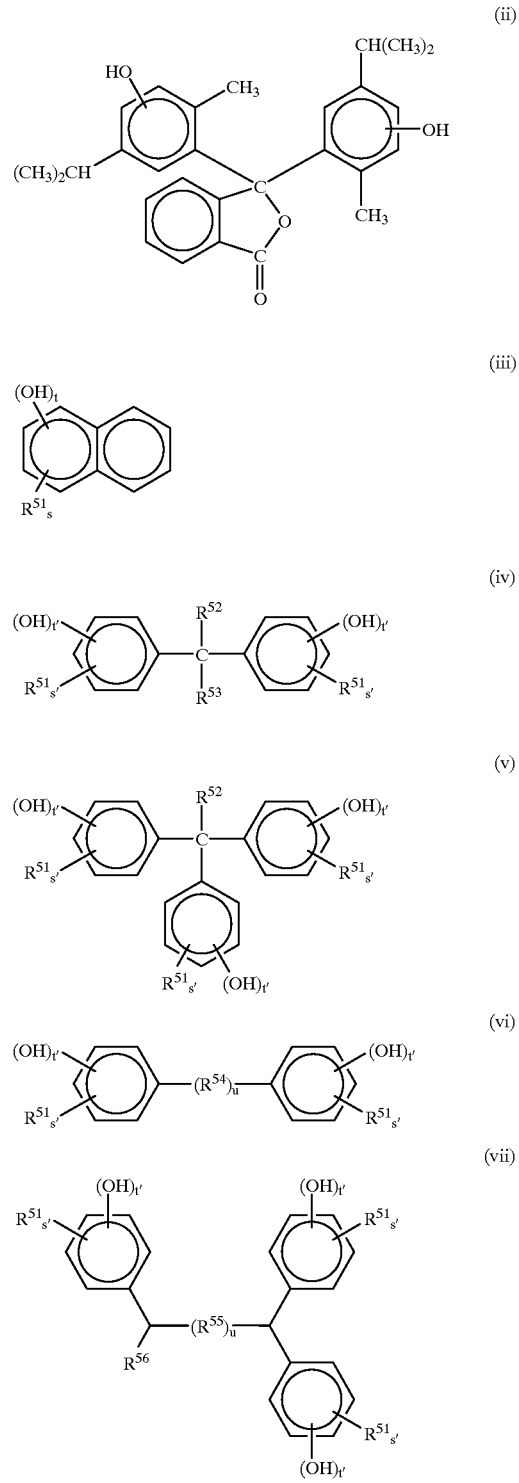

-continued

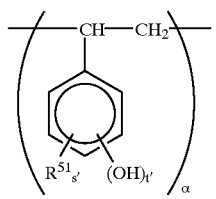

(viii)

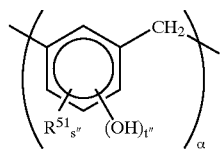

(ix)

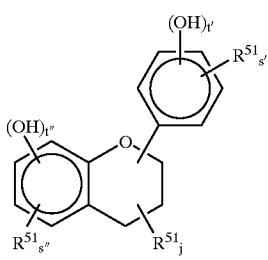

(x)

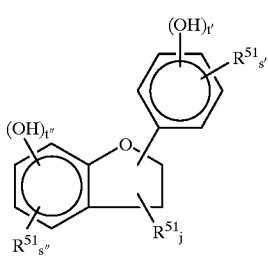

(xi)

In the formulae, $R^{51}$ and $R^{52}$ are independently a hydrogen atom or normal or branched alkyl or alkenyl group having 1 to 8 carbon atoms. $R^{53}$ is a hydrogen atom, normal or branched alkyl or alkenyl group having 1 to 8 carbon atoms, or —$(R^{57})_n$—COOH. $R^{54}$ is a group —$(CH_2)_i$— wherein i is 2 to 10, arylene group having 6 to 10 carbon atoms, carbonyl group, sulfonyl group, oxygen atom or sulfur atom. $R^{55}$ is an alkylene group having 1 to 10 carbon atoms, arylene group having 6 to 10 carbon atoms, carbonyl group, sulfonyl group, oxygen atom or sulfur atom. $R^{56}$ is a hydrogen atom, normal or branched alkyl group having 1 to 8 carbon atoms, alkenyl group, hydroxyl-substituted phenyl group or hydroxyl-substituted naphthyl group. $R^{57}$ is a normal or branched alkylene group having 1 to 10 carbon atoms. Letter j is an integer of 0 to 5, u and h each are 0 or 1, and s, t, s', t', s", and t" are numbers satisfying s+t=8, s'+t'=5, and s"+t"=4 such that at least one hydroxyl group is attached to each phenyl skeleton. α is such a number that the compound of formula (viii) or (ix) may have a molecular weight of 100 to 1000.

Exemplary groups represented by $R^{51}$ and $R^{52}$ are hydrogen, methyl, ethyl, propyl, butyl, ethynyl, and cyclohexyl groups. Exemplary groups represented by $R^{53}$ are as exemplified for $R^{51}$ and $R^{52}$ as well as —COOH and —CH$_2$COOH. Exemplary groups represented by $R^{54}$ are ethylene, phenylene, carbonyl, and sulfonyl groups, oxygen and sulfur atoms. Exemplary groups represented by $R^{55}$ are methylene and as exemplified for $R^{54}$. Exemplary groups represented by $R^{56}$ are hydrogen, methyl, ethyl, propyl, butyl, ethynyl, cyclohexyl, and hydroxyl-substituted phenyl and naphthyl groups.

The acid labile group in the dissolution regulator includes groups of formulae (6) and (7), tert-alkyl groups of 4 to 20 carbon atoms, trialkylsilyl groups whose alkyl groups each have 1 and 6 carbon atoms, and oxoalkyl groups of 4 to 20 carbon atoms.

The dissolution regulator in the form of a compound whose phenolic hydroxyl group is partially replaced by an acid labile group is preferably blended in the resist composition in an amount of 0 to about 50 parts, more preferably about 5 to 50 parts, most preferably 10 to 30 parts by weight per 100 parts by weight of the base resin. At least 5 parts of the dissolution regulator would be necessary to be effective form improving resolution whereas more than 50 parts would induce pattern thinning and detract from resolution.

The dissolution regulator mentioned above can be synthesized by chemically reacting an acid labile group with a compound having a phenolic hydroxyl group as in the preparation of the base resin.

As dissolution regulator (D), a compound having a weight average molecular weight of less than 1,000 and a phenolic hydroxyl group in a molecule wherein the hydrogen atom of the phenolic hydroxyl group is partially replaced by an acid labile group in an average proportion of 0% to 100% may be blended in addition to or instead of the above-mentioned compound. This compound is referred to as second compound or dissolution regulator.

The second compound in which the hydrogen atom of a phenolic hydroxyl group is partially replaced by an acid labile group is preferably selected from compounds comprising recurring units of the following general formula (15) and having a weight average molecular weight of more than 1,000 to 3,000.

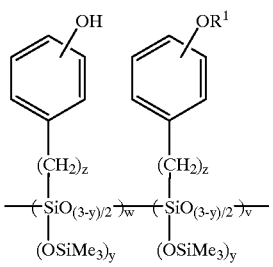

(15)

In formula (15), $R^1$ is an acid labile group, letters v and w are numbers satisfying $0 \leq v/(v+w) \leq 0.6$.

The acid labile group in the second dissolution regulator includes groups of formulae (6) and (7), tert-alkyl groups of 4 to 20 carbon atoms, trialkylsilyl groups whose alkyl groups each have 1 to 6 carbon atoms; and oxoalkyl groups of 4 to 20 carbon atoms.

The blending amount of the first and second dissolution regulators combines is preferably 0 to 50 parts, more preferably 0 to 30 parts, especially 1 to 30 parts by weight per 100 parts by weight of the base resin.

The second dissolution regulator can be synthesized by chemically reacting an acid labile group with a compound having a phenolic hydroxyl group as in the preparation of the base resin.

A silicone compound is also useful as the dissolution regulator (D) because it does not adversely affect oxygen plasma etching resistance. The silicone compound dissolution regulators which can be used herein are silicone compounds of the following general formulae (16) to (18) wherein carboxyl groups or hydroxyl groups are protected with tert-butyl or tert-butoxycarbonylmethyl groups.

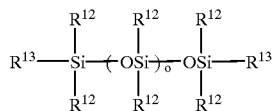
(16)

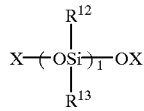
(17)

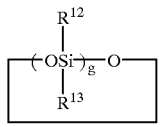
(18)

In the formulae, $R^{12}$ is a methyl or phenyl group, $R^{13}$ is a carboxyethyl or p-hydroxyphenylalkyl group, X is a trimethylsilyl, triphenylsilyl or —$SiR^{12}R^{13}$ group wherein $R^{12}$ and $R^{13}$ are as defined above, letter e is an integer of 0 to 50, f is an integer of 1 to 50, and g is an integer of 3 to 10.

The silicone compounds obtained by protecting the carboxyl or hydroxyl groups of the silicone compounds of formulae (16) to (18) with alkali-soluble groups (e.g., tert-butyl or tert-butoxycarbonylmethyl groups) are exemplified by groups of the following classes A to C. Me is methyl and t—Bu is tert-butyl.

Class A

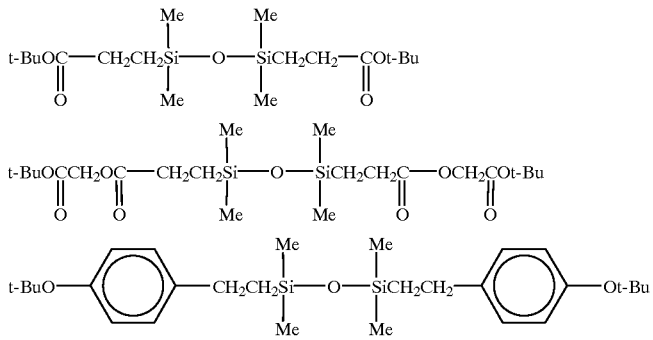

Class B

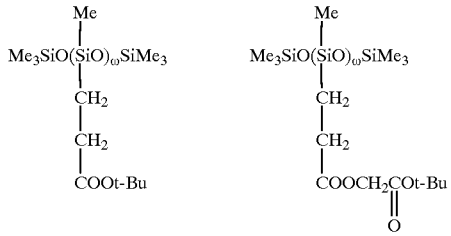

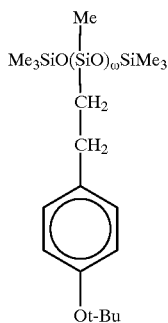

ω is 1 to 50.

Class C

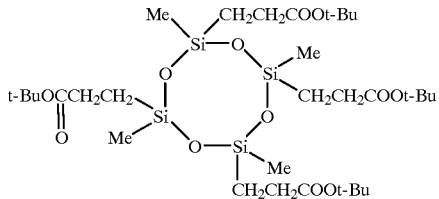

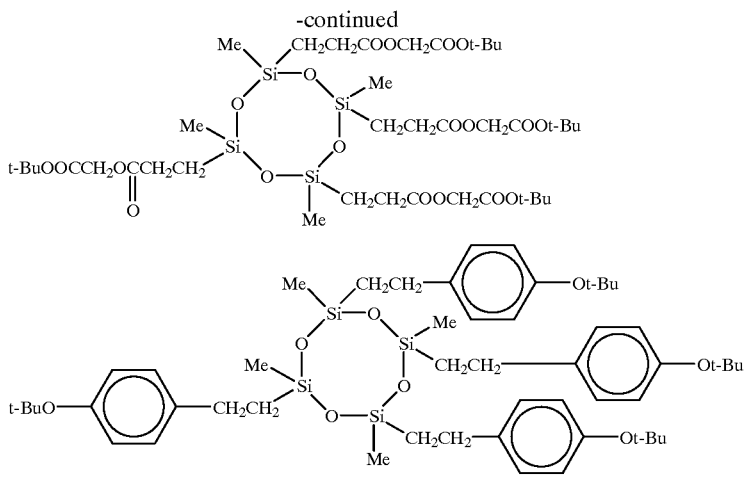

The amount of the silicone compound dissolution regulator blended is preferably 0 to 60 parts, more preferably 0 to 50 parts by weight per 100 parts by weight of the base resin. More than 60 parts of the silicone compound dissolution regulator would detract from the oxygen plasma etching resistance of the composition to such an extent that the composition might not be applicable as the two-layer resist.

In the resist composition of the invention, a basic compound (E) may be blended. The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure latitude and pattern profile.

Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, amide derivatives, and imide derivatives.

Examples of the primary aliphatic amine include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of the secondary aliphatic amine include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of the tertiary aliphatic amine include trimethylamine, triethylamine, tri-n-propylamine, tri-iso-propylamine, trim-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethyltetraethylenepentamine.

Examples of the hybrid amine include dimethylethylamine, methylethylpropylamine, benzylamine, phenethylamine, and benzyldimethylamine. Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline, pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenathroline derivatives, adenine derivatives, adenosine derivatives, guanine derivatives, guanosine derivatives, uracil derivatives, and uridine derivatives.

Examples of the carboxyl-bearing nitrogenous compound include aminobenzoic acid, indolecarboxylic acid, amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound include 3-pyridinesulfonic acid and pyridinium p-toluenesulfonate. Examples of the hydroxyl-bearing nitrogenous compound, hydroxyphenyl-bearing nitrogenous compound, and alcoholic nitrogenous compound include 2-hydroxypyridine, aminocresole, 2,4-quinoline diol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy) ethyl]-piperazine, piperidine ethanol, 1-(2-hydroxyethyl)-pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl) isonicotinamide. Examples of the amide derivative include formamide, N-methylformamide, N,N-dimethylformamide, acetamide, N-methylacetamide, N,N-dimethylacetamide, propionamide, and benzamide. Exemplary imide derivatives are phthalimide, succinimide, and maleimide.

Also included are basic compounds of the following general formulae (19) and (20).

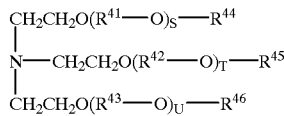

(19)

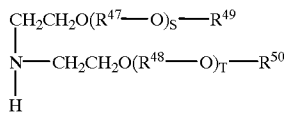

(20)

In formulae (19) and (20), $R^{41}$, $R^{42}$, $R^{43}$, $R^{47}$, and $R^{48}$ are independently normal, branched or cyclic alkylene groups of 1 to 20 carbon atoms. $R^{44}$, $R^{45}$, $R^{46}$, $R^{49}$, and $R^{50}$ are independently hydrogen, alkyl groups of 1 to 20 carbon atoms, or amino groups. Alternatively, $R^{44}$ and $R^{45}$, $R^{45}$ and $R^{46}$, $R^{44}$ and $R^{46}$, or $R^{44}$ and $R^{45}$ and $R^{46}$, and $R^{49}$ and $R^{50}$, taken together, may form a ring. S, T and U are integers of 0 to 20, with the proviso that hydrogen is excluded from $R^{44}$, $R^{45}$, $R^{46}$, $R^{49}$, and $R^{50}$ when S, T and U are equal to 0.

The alkylene groups represented by $R^{41}$, $R^{42}$, $R^{43}$, $R^{47}$, and $R^{48}$ are preferably those of 1 to 20 carbon atoms, more preferably 1 to 10 carbon atoms, most preferably 1 to 8 carbon atoms, such as methylene, ethylene, n-propylene, isopropylene, n-butylene, isobutylene, n-pentylene, isopentylene, hexylene, nonylene, decylene, cyclopentylene, and cyclohexylene. The alkyl groups represented by $R^{44}$, $R^{45}$, $R^{46}$, $R^{49}$, and $R^{50}$ are preferably those of 1 to 20 carbon atoms, more preferably 1 to 8 carbon atoms, most preferably 1 to 6 carbon atoms, while they may be normal, branched or cyclic. Exemplary alkyl groups are methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl. Where $R^{44}$ and $R^{45}$, $R^{45}$ and $R^{46}$, $R^{44}$ and $R^{46}$, or $R^{44}$ and $R^{45}$ and $R^{46}$, or $R^{49}$ and $R^{50}$ form a ring, the ring preferably has 1 to 20 carbon atoms, more preferably 1 to 8 carbon atoms, most preferably 1 to 6 carbon atoms and may have branched therefrom and alkylene group of 1 to 6 carbon atoms, especially 1 to 4 carbon atoms. Each of S, T and U is an integer of 0 to 20, preferably 1 to 10, more preferably 1 to 8.

Illustrative examples of the compounds of formulae (19) and (20) include tris{2-(methoxymethoxy)ethyl}amine, tris{2-(methoxyethoxy)ethyl}amine, tris[2-{(2-methoxyethoxy)methoxy}ethyl]amine, tris {2-(2-methoxyethoxy)ethyl}amine, tris{2-(1-methoxyethoxy) ethyl}amine, tris{2-(1-ethoxyethoxy)ethyl}amine, tris{2-(1-ethoxypropoxy)ethyl}amine, tris[2-{(2-hydroxyethoxy) ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6.

Especially preferred basic compounds are tertiary amine, aniline derivatives, pyrrolidine derivatives, pyridine derivatives, quinoline derivatives, amic acid derivatives, nitrogenous compounds having a hydroxyl group, nitrogenous compounds having a hydroxyphenyl group, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy) methyl}ethyl]amine, and 1-aza-15-crown-5.

The above-mentioned basic compounds may be used alone or in admixture of two or more. Preferably the basic compound is blended in an amount of 0 to about 2 parts, especially about 0.01 to 1 part by weight per 100 parts by weight of the base resin. More than 2 parts of the basic compound would adversely affect sensitivity.

Component (F) is another base resin in the form of a high molecular weight compound or polymer different from the crosslinked polymer defined as component (B). More preferably, component (F) is a polymer comprising recurring units of the following general formula (21) and having a weight average molecular weight of 3,000 to 300,000. The blending of component (F) is advantageous in that the size and shape of a resist pattern can be controlled as desired.

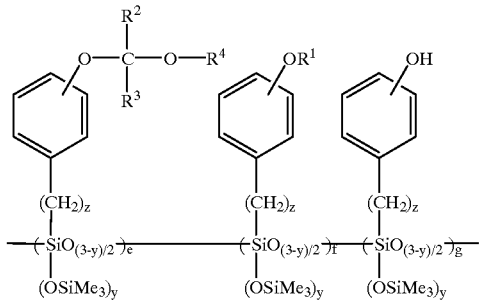

(21)

In formula (21), ME, $R^2$ to $R^4$, y and z are as defined above. $R^1$ is an acid labile group different from formula (6), for example, a group of the general formula (7), tert-alkyl group of 4 to 20 carbon atoms, trialkylsilyl group whose alkyl groups each have 1 to 6 carbon atoms, or oxoalkyl group of 4 to 20 carbon atoms. Letters e and f each are 0 or a positive number, e and f can be 0 at the same time, g is a positive number satisfying e+f+g=1. Their rations are $0 \leq e/(e+f+g) \leq 0.5$, $0 \leq f/(e+f+g) \leq 0.5$ and $0.4 \leq g/(e+f+g) \leq 0.9$, preferably $0.1 \leq e/(e+f+g) \leq 0.4$, $0 \leq f/(e+f+g) \leq 0.2$ and $0.6 \leq g/(e+f+g) \leq 0.8$. If the proportion of e to the total (e+f+g) is more than 0.5, if the proportion of f to the total is more than 0.5, or if the proportion of g to the total is more than 0.9 or less than 0.4, then the contrast between alkali dissolution rates would lower to detract from resolution. By properly selecting the values of e, f and g within the above-defined ranges, the size and shape of a resist pattern can be controlled as desired.

The polymer has a weight average molecular weight (Mw) of 3,000 to 300,000, preferably 5,000 to 30,000. with Mw<3,000, a resist composition is less resistant to heat. With Mw>300,000, a resist composition becomes low in alkali dissolution and hence, resolution.

Preferably the base resin (F) is blended with the base resin (B) in the form of a crosslinked polymer in a weight ratio of from 0:100 to 90:10, more preferably from 0:100 to 50:50. If the base resin (F) is blended in excess of this weight ratio range relative to the base resin (B), the desired effect of the crosslinked polymer as base resin (B) would be somewhat lost.

In the resist composition of the invention, an acetylene alcohol derivative may be blended as component (G) for improving shelf stability. The acetylene alcohol derivative used herein is preferably selected from compounds of the following general formulae (22) and (23).

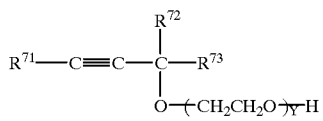
(22)

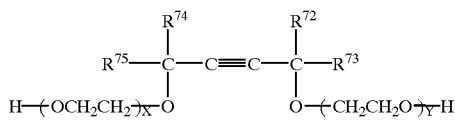
(23)

In formulae (22) and (23), $R^{71}$, $R^{72}$, $R^{73}$, $R^{74}$, and $R^{75}$ each are hydrogen or a normal, branched or cyclic alkyl group having 1 to 8 carbon atoms, X and Y are 0 or positive numbers satisfying $0 \leq X \leq 30$, $0 \leq Y \leq 30$, and $0 \leq X+Y \leq 40$.

Useful acetylene alcohol derivatives are commercially available under the trade name of Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc. and Surfynol E1004 from Nisshin Chemical Industry K.K.

The acetylene alcohol derivative is preferably added in an amount of 0.01 to 2%, more preferably 0.02 to 1% by weight based on the resist composition. Less than 0.01% by weight of the acetylene alcohol derivative would be ineffective for improving coating and shelf stability whereas more than 2% by weight would result in a resist composition with low resolution.

The resist composition of the invention may further contain various additives, for example, a surface-active agent for facilitating coating. The amounts of such optional additives blended are conventional insofar as the objects of the invention are not impaired. Nonionic surfactants are preferred. Examples of the surfactant include perfluoroalkylpolyoxyethylene ethanols, fluorinated alkyl esters, perfluoroalkylamine oxides, perfluoroalkyl ethylene oxide adducts, and fluorinated organosiloxane compounds. Useful surfactants are commercially available under the trade name of Florade FC-430 and FC-431 from Sumitomo 3M K.K., Surflon S-141 and S-145 from Asahi Glass K.K., Unidine DS-401, DS-403 and DS-451 from Daikin Industry K.K., Megafac F-8151 from Dai-Nihon Ink Industry K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Any well-known lithography may be used to form a resist pattern from a positive resist composition of the invention. For example, the resist composition is spin coated onto a substrate, typically a silicon wafer and prebaked on a hot plate at a temperature of 60 to 150° C. for about 1 to 10 minutes, preferably 80 to 120° C. for 1 to 5 minutes. The resulting resist film is generally 0.5 to 2.0 μm thick. With a mask having a desired pattern placed above the resist film, the resist film is then exposed to actinic radiation having a wavelength of up to 300 nm such as deep-UV, excimer laser light, and X-ray or electron beam in an exposure dose of about 1 to 200 mJ/cm², preferably about 10 to 100 mJ/cm². The film is further baked on a hot plate at 60 to 150° C. for 1 to 5 minutes, preferably 80 to 120° C. for 1 to 3 minutes (post-exposure baking=PEB). Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably ½ to 2 minutes by a conventional technique such as dipping, paddling or spraying. In this way, a desired positive resist pattern is formed on the substrate. The chemically amplified positive resist composition of the invention is best suited for fine patterning with actinic radiation, especially radiation having a wavelength of 254 to 193 nm such as deep-UV, excimer laser light, and X-ray and electron beam. Outside the range, a failure to provide the desired pattern can occur.

The resist material of the invention is useful as a two-layer resist since it uses a silicone polymer as the base resin and is fully resistant to oxygen plasma etching. More particularly, a relatively thick organic polymer layer is formed on a substrate as a lower resist layer before a resist solution formulated according to the invention is spin coated thereon. The upper resist film of the invention is processed as above to form a resist pattern. Thereafter, the resist layers are subject to oxygen plasma etching. The lower resist layer is selectively etched away whereby the pattern of the upper resist layer is formed in the lower resist layer.

For the lower resist layer, a novolak resin based positive resist composition may be used. After it is coated onto a substrate, it is subject to hard baking at 200° C. for one hour, thereby preventing intermixing with the overlying inventive resist composition.

There has been described a chemical amplification positive working resist composition which is sensitive to actinic radiation has superior sensitivity and resolution, and lends itself to fine processing technology using electron beam and deep-UV radiation. Because of very low absorption at the exposure wavelength of a KrF excimer laser, the resist composition forms a fine pattern having a wall perpendicular to the substrate. Because the resist composition of the invention has high oxygen plasma etching resistance, a two-layer resist having a resist film of the invention coated on a lower resist layer can be finely patterned at a high aspect ratio.

EXAMPLE

Examples of the present invention are given below by way of illustration and not by way of limitation. Mw is a weight average molecular weight

Synthesis Example 1
Synthesis of poly(p-hydroxybenzylsilsesquioxane)

A reactor was charged with 1,200 ml of water. With stirring at 30° C., a mixture of 487.2 g (2.0 mol) of p-methoxybenzyltrichlorosilane and 600 ml of toluene was added dropwise over 2 hours for hydrolysis. The aqueous layer was separated off and the organic layer was repeatedly washed with water until the water layer became neutral. Hexamethylsilazane, 80 g, was added to the organic layer, which was refluxed for 5 hours. After cooling, the toluene and unreacted hexamethylsilazane were evaporated off by means of an evaporator. The residue was dissolved in 400 g of acetonitrile. Trimethylsilyl iodide, 480 g, was added dropwise to the solution below 60° C. Reaction was continued for 10 hours at 60° C. After the completion of reaction, 200 g of water was added to the reaction solution for hydrolysis. The polymer layer was collected by decantation. After the solvent was evaporated off by means of an evaporator, the polymer was dried in vacuum, obtaining 330 g of poly(p-hydroxybenzylsilsesquioxane). The polymer was measured for molecular weight by gel permeation chromatography (GPC), finding a Mw=3,500 on a polystyrene basis. On $^{29}$Si—NMR analysis, the peak attributable on a SiOH group was not observed at −62 ppm, which indicated that the SiOH groups had been blocked with trimethylsilyl groups.

Synthesis Example 2

In a 2-liter flask, 160 g of the poly(p-hydroxybenzylsilsesquioxane) obtained in Synthesis Example 1 was dissolved in 1,000 ml of dimethylformamide, and a catalytic amount of p-toluenesulfonic acid was added. With stirring at 20° C., 19.0 g of ethyl vinyl ether and 6.0 g of triethylene glycol divinyl ether were added. After one hour of reaction, the reaction solution was neutralized with conc. aqueous ammonia, and the neutralized solution was added dropwise to 10 liters of water whereupon a white solid formed. After filtration, the solid was dissolved in 500 ml of acetone, which was added dropwise to 10 liters of water. After filtration, the polymer was dried in vacuum. It was ascertained from $^1$H-NMR analysis of the polymer, designated Polym.1, that 20% of the hydrogen atoms of hydroxyl groups in poly(p-hydroxybenzylsilsesquioxane) were ethoxyethylated and 3% crosslinked.

Synthesis Example 3

A polymer was prepared as in Synthesis Example 2 except that 5.0 g of 1,4-di(vinylether)cyclohexanone was used instead of the triethylene glycol divinyl ether. It was ascertained from $^1$H-NMR analysis of the polymer, designated Polym.2, that 20% of the hydrogen atoms of hydroxyl groups in poly(p-hydroxybenzylsilsesquioxane) were ethoxyethylated and 2.5% crosslinked.

Synthesis Example 4

A polymer was prepared as in Synthesis Example 2 except that 10.0 g of 1,4-di(vinylether)cyclohexanone was used instead of the triethylene glycol divinyl ether. It was ascertained from $^1$H-NMR analysis of the polymer, designated Polym.3, that 19% of the hydrogen atoms of hydroxyl groups in poly(p-hydroxybenzylsilsesquioxane) were ethoxyethylated and 4.8% crosslinked.

Synthesis Example 5

A polymer was prepared as in Synthesis Example 2 except that 27.0 g of 1-ethoxypropene was used instead of the ethyl vinyl ether. It was ascertained from $^1$H-NMR analysis of the polymer, designated Polym.4, that 20% of the hydrogen atoms of hydroxyl groups in poly(p-hydroxybenzylsilsesquioxane) were ethoxyethylated and 2.9% crosslinked.

Synthesis Example 6

A polymer was prepared as in Synthesis Example 2 except that 35.0 g of 1-ethoxypropene was used instead of the ethyl vinyl ether. It was ascertained from $^1$H-NMR analysis of the polymer, designated Polym.5, that 19.5% of the hydrogen atoms of hydroxyl groups in poly(p-hydroxybenzylsilsesquioxane) were ethoxypropylated and 2.8% crosslinked.

Synthesis Example 7

A polymer was prepared as in Synthesis Example 2 except that 30.0 g of 2,3-dihydrofuran was used instead of the ethyl vinyl ether. It was ascertained from $^1$H-NMR analysis of the polymer, designated Polym.6, that 19.0% of the hydrogen atoms of hydroxyl groups in poly(p-hydroxybenzylsilsesquioxane) were replaced by tetrahydrofuranyl and 3% crosslinked.

Synthesis Example 8

In 1,200 ml of pyridine was dissolved 150 g of the partially crosslinked ethoxyethylated poly(p-hydroxybenzylsilsesquioxane) (Polym.1) obtained in Synthesis Example 2. With stirring at 45° C., 6.5 g of di-tert-butyl dicarbonate was added. After one hour of reaction, the reaction solution was added dropwise to 10 liters of water whereupon a white solid formed. After filtration, the solid was dissolved in 500 ml of acetone, which was added dropwise to 10 liters of water. After filtration, the polymer was dried in vacuum. It was ascertained from $^1$H-NMR analysis of the polymer, designated Polym.7, that 20% of the hydrogen atoms of hydroxyl groups in poly(p-hydroxybenzylsilsesquioxane) were ethoxyethylated, 3% crosslinked, and 3.0% replaced by t-Boc.

Synthesis Examples 9–13

By introducing t-Boc groups into the polymers designated Polym.2 to Polym.6 as in Example 8, polymers designated Polym.8 to Polym.12 were obtained.

Synthesis Example 14

A polymer was prepared as in Synthesis Example 2 except that 20.0 g of N,N'-bis(hydroxyethoxycarbonyl) phenylenediamine was used instead of the triethylene glycol divinyl ether. It was ascertained from $^1$H-NMR analysis of the polymer that 18.0% of the hydrogen atoms of hydroxyl groups in poly(p-hydroxybenzylsilsesquioxane) were ethoxyethylated and 1.9% crosslinked.

By introducing t-Boc groups into the polymer as in Example 8, a polymer designated Polym.13 was obtained.

The thus obtained polymers had structures as shown by the following rational formula. Percent substitutions of the hydrogen atoms of hydroxyl groups in poly(p-hydroxybenzylsilsesquioxane) are shown in Table 1. In the following formulae, R represents a group providing inter-molecular or intramolecular crosslinking of the following units, and (R) represents the attachment of the crosslinking group R.

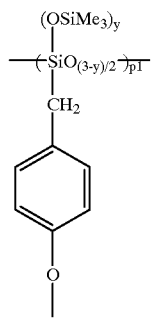

TABLE 1

| Synthesis Example | Polym. | p2 | p1 | q1 | q2 | Mw |
|---|---|---|---|---|---|---|
| 2 | 1 | 77.0 | 3.0 | 20.0 | 0 | 4,000 |
| 3 | 2 | 77.5 | 2.5 | 20.0 | 0 | 3,800 |
| 4 | 3 | 76.2 | 4.8 | 19.0 | 0 | 4,700 |
| 5 | 4 | 77.1 | 2.9 | 20.0 | 0 | 3,900 |
| 6 | 5 | 77.7 | 2.8 | 19.5 | 0 | 3,900 |
| 7 | 6 | 78.0 | 3.0 | 19.0 | 0 | 4,000 |
| 8 | 7 | 74.0 | 3.0 | 20.0 | 3.0 | 4,000 |
| 9 | 8 | 74.5 | 2.5 | 20.0 | 3.0 | 3,700 |
| 10 | 9 | 73.2 | 4.8 | 19.0 | 3.0 | 4,600 |
| 11 | 10 | 74.1 | 2.9 | 20.0 | 3.0 | 3,900 |
| 12 | 11 | 74.7 | 2.8 | 19.5 | 3.0 | 3,800 |
| 13 | 12 | 75.0 | 3.0 | 19.0 | 3.0 | 4,100 |
| 14 | 13 | 77.1 | 1.9 | 18.0 | 3.0 | 3,700 |

Polym.1

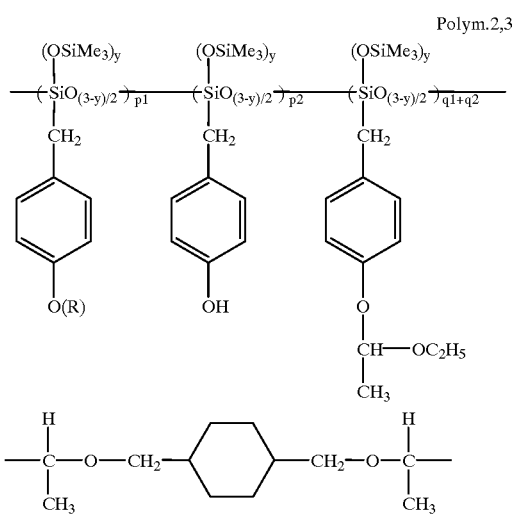

Polym.2,3

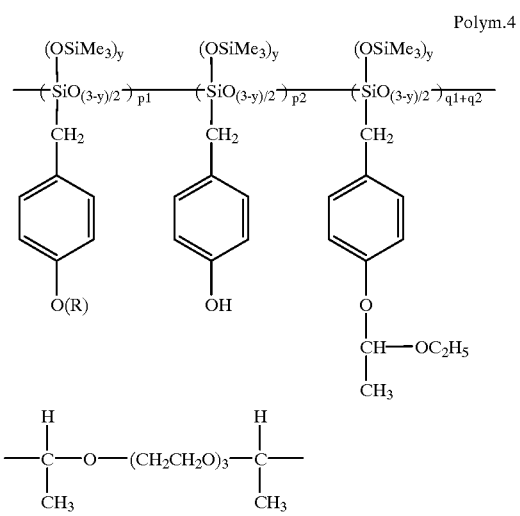

Polym.4

Polym.5

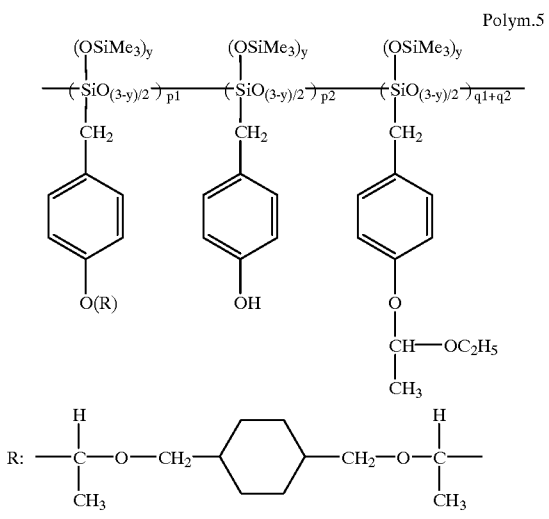

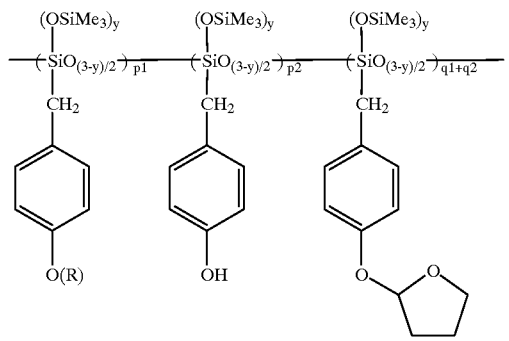
Polym.6
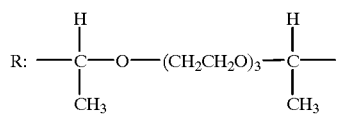
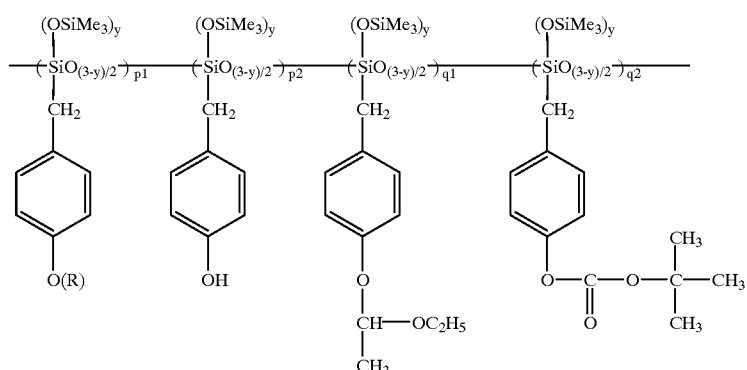
Polym.7
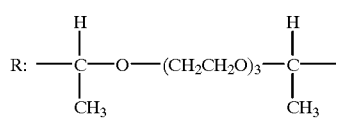
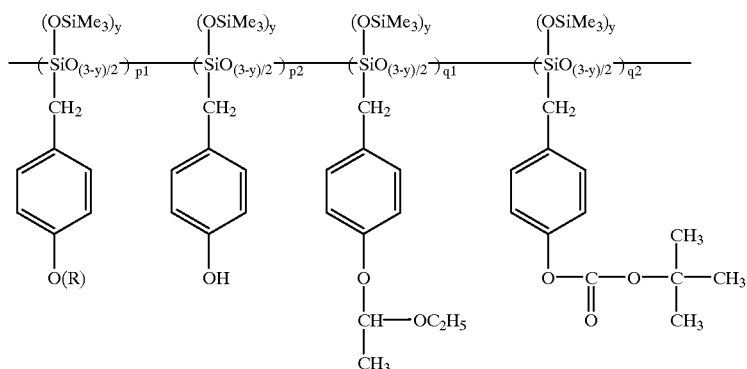
Polym.8,9
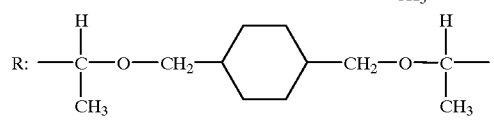

Polym.10
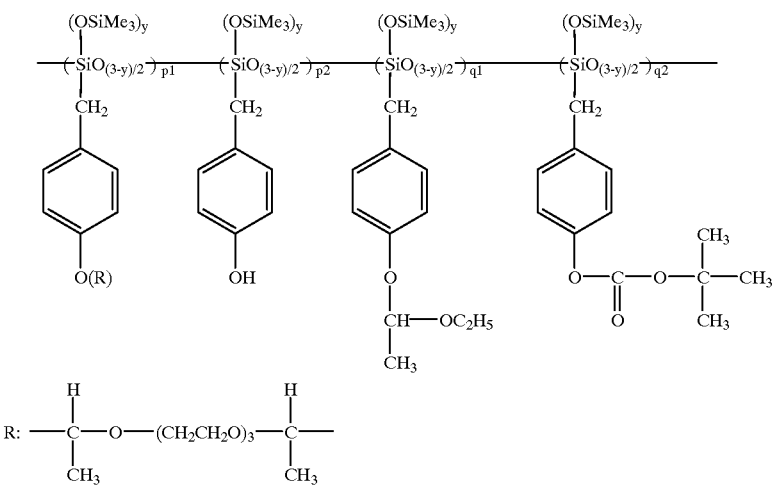
Polym.11
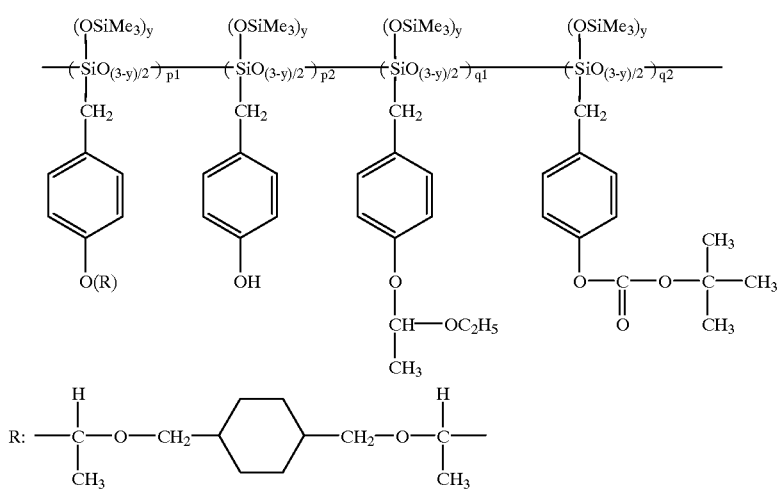
Polym.12
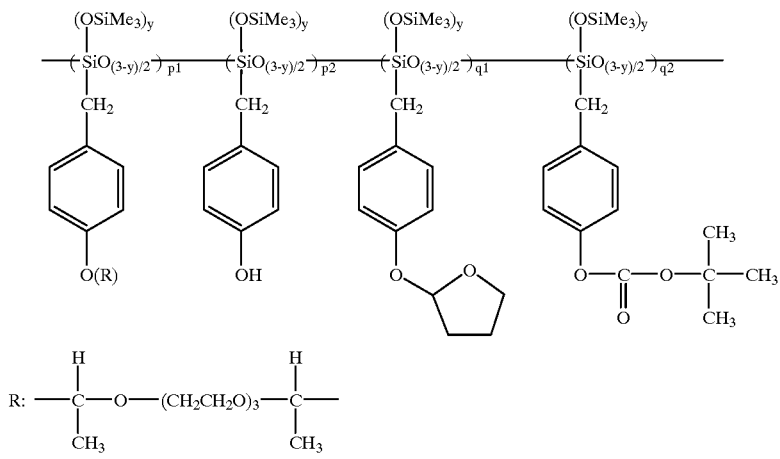

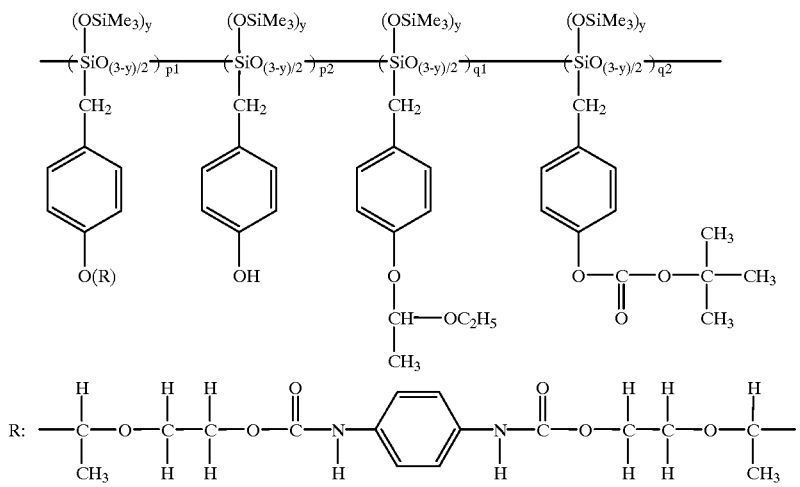

Polym.11

Examples 1–35 & Comparative Example 1–3

Liquid resist compositions were prepared by dissolving a polymer designated (Polym.1 to Polym.13) as a base resin, a photoacid generator designated PAG.1 to PAG.7, a dissolution regulator designated DRR.1 to DRR.6, and a basic compound in a solvent in accordance with the formulation shown in Tables 2 and 3. The solvents used herein are propylene glycol monoethyl ether acetate (PGMEA), a mixture of propylene glycol monoethyl ether acetate and ethyl lactate (PGMEA/EL), and diethylene glycol monomethyl ether (DGLM).

For comparison purposes, liquid resist compositions were similarly prepared in accordance with the formulation shown in Table 4 using polymers designated Polym.14 and Polym.15 as the base resin.

Each of the compositions was passed through a 0.2-μm Teflon® filter. The liquid resist composition was then spin coated onto a silicon wafer to a thickness of 0.4 μm. With the silicon wafer rested on a hot plate at 100° C., the coating was pre-baked for 90 seconds. The film was exposed to light by means of an excimer laser stepper model NSR-2005EX8A (manufactured by Nikon K.K., numerical aperture NA=0.5) through a mask having a desired pattern, baked at 110° C. for 90 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure dose with which the top and bottom of a 0.24-μm line-and-space pattern were resolved at 1:1 was the optimum exposure dose (sensitivity Eop), the minimum line width of a line-and-space pattern which was recognized separate at this exposure dose was the resolution of a test resist. The profile of the resist pattern resolved was observed under a scanning electron microscope. The edge roughness of a 0.25-μm line-and-space pattern was also observed under a scanning electron microscope.

Tables 2 to 4 show the test results of Examples and Comparative Examples as well as the formulation of resist compositions.

(PAG. 1)

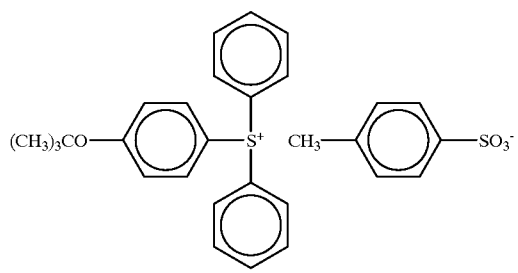

(PAG. 2)
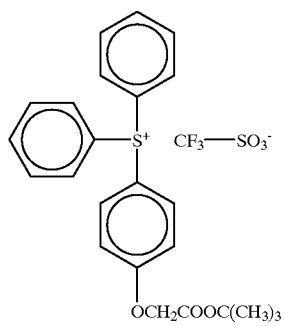
(PAG. 3)
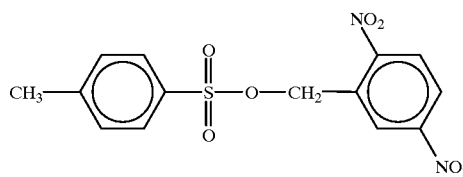
(PAG. 4)
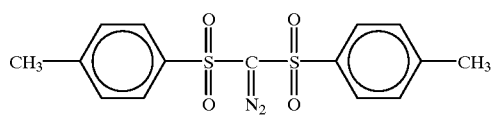
(PAG. 5)
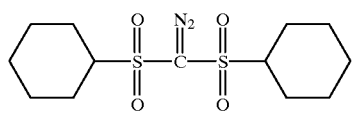
(PAG. 6)
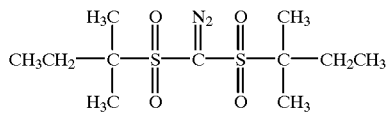
(PAG. 7)
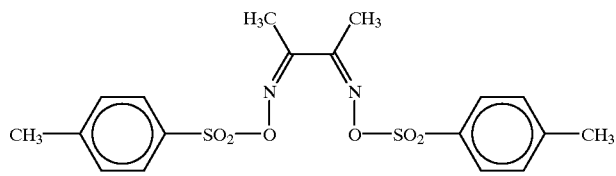
(DRR. 1)
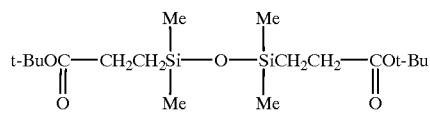
(DRR. 2)
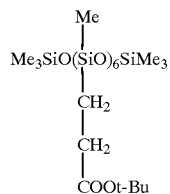

(DRR. 3)
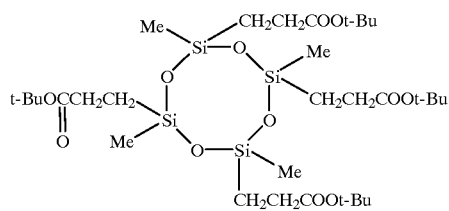
(DRR.4)
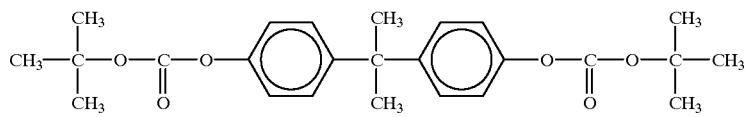
(DRR.5)
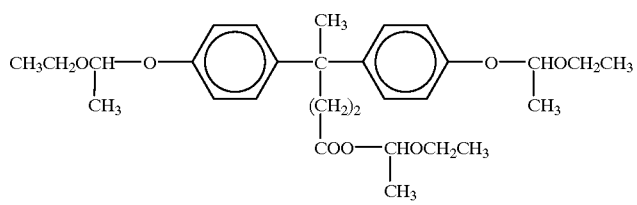
(DRR.6)
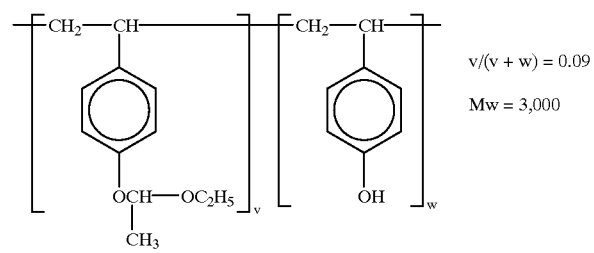
v/(v + w) = 0.09
Mw = 3,000
Polym. 14
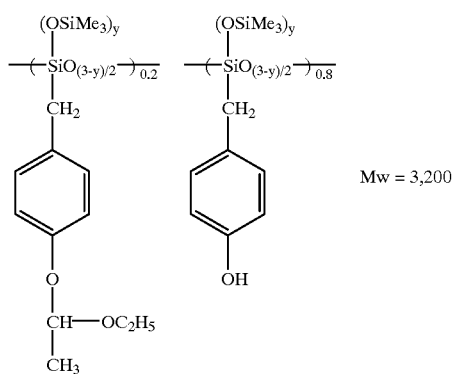
Mw = 3,200

Polym. 15

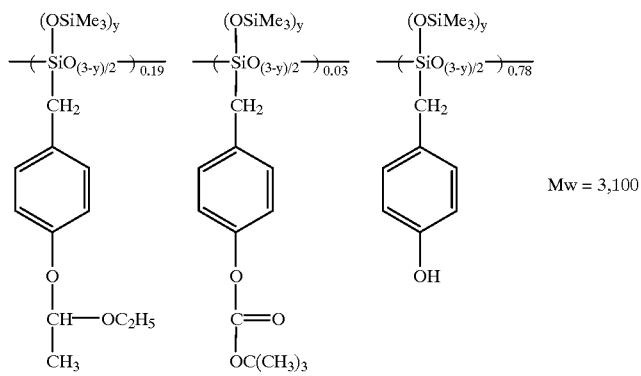

Mw = 3,100

TABLE 2

| No. | Base resin | Resist composition (pbw in parentheses) | | | | Sensitivity Eth (mJ/cm$^2$) | Resolution ($\mu$m) | Profile |
|---|---|---|---|---|---|---|---|---|
| | | Photoacid generator | Dissolution regulator | Basic compound | Organic solvent | | | |
| E1 | Polym. 1 (80) | PAG. 1 (4) | — | — | PGMEA (600) | 9.0 | 0.20 | rectangular |
| E2 | Polym. 1 (80) | PAG. 1 (4) | — | — | PGMEA (420)/ EL (180) | 9.1 | 0.20 | rectangular |
| E3 | Polym. 1 (80) | PAG. 1 (4) | — | — | PGMEA (600) | 9.5 | 0.22 | rectangular |
| E4 | Polym. 2 (80) | PAG. 1 (4) | — | — | PGMEA (600) | 9.2 | 0.20 | rectangular |
| E5 | Polym. 3 (80) | PAG. 1 (4) | — | — | PGMEA (600) | 9.1 | 0.20 | rectangular |
| E6 | Polym. 4 (80) | PAG. 1 (4) | — | — | PGMEA (600) | 10.1 | 0.20 | rectangular |
| E7 | Polym. 5 (80) | PAG. 1 (4) | — | — | PGMEA (600) | 9.2 | 0.20 | rectangular |
| E8 | Polym. 6 (80) | PAG. 1 (4) | — | — | PGMEA (600) | 11.0 | 0.22 | rectangular |
| E9 | Polym. 7 (80) | PAG. 1 (4) | — | — | PGMEA (600) | 9.8 | 0.20 | rectangular |
| E10 | Polym. 8 (80) | PAG. 1 (4) | — | — | PGMEA (600) | 9.5 | 0.20 | rectangular |
| E11 | Polym. 9 (80) | PAG. 1 (4) | — | — | PGMEA (600) | 9.5 | 0.20 | rectangular |
| E12 | Polym. 10 (80) | PAG. 1 (4) | — | — | PGMEA (600) | 9.4 | 0.20 | rectangular |
| E13 | Polym. 11 (80) | PAG. 1 (4) | — | — | PGMEA (600) | 9.5 | 0.20 | rectangular |
| E14 | Polym. 12 (80) | PAG. 1 (4) | — | — | PGMEA (600) | 9.6 | 0.20 | rectangular |
| E15 | Polym. 13 (80) | PAG. 1 (4) | — | — | PGMEA (600) | 21.0 | 0.22 | rectangular |
| E16 | Polym. 1 (80) | PAG. 2 (4) | — | — | PGMEA (600) | 5.0 | 0.20 | rectangular |
| E17 | Polym. 1 (80) | PAG. 3 (4) | — | — | PGMEA (400) | 15.0 | 0.22 | rectangular |
| E18 | Polym. 1 (80) | PAG. 4 (4) | — | — | PGMEA (600) | 17.0 | 0.22 | rectangular |

TABLE 3

| No. | Base resin | Resist composition (pbw in parentheses) | | | | Sensitivity Eth (mJ/cm$^2$) | Resolution ($\mu$m) | Profile |
|---|---|---|---|---|---|---|---|---|
| | | Photoacid generator | Dissolution regulator | Basic compound | Organic solvent | | | |
| E19 | Polym. 1 (80) | PAG. 5 (4) | — | — | PGMEA (600) | 15.0 | 0.22 | rectangular |
| E20 | Polym. 1 (80) | PAG. 6 (4) | — | — | PGMEA (600) | 16.2 | 0.22 | rectanqular |
| E21 | Polym. 1 (80) | PAG. 7 (4) | — | — | PGMEA (600) | 12.0 | 0.24 | sl. forward tapered |
| E22 | Polym. 1 (80) | PAG. 1 (4) | DRR. 1 (15) | — | PGMEA (600) | 9.3 | 0.20> | rectangular |
| E23 | Polym. 1 (80) | PAG. 1 (4) | DRR. 2 (15) | — | PGMEA (400) | 9.4 | 0.20> | rectangular |
| E24 | Polym. 1 (80) | PAG. 1 (4) | DRR. 3 (15) | — | PGMEA (400) | 9.6 | 0.20 | rectangular |
| E25 | Polym. 1 (80) | PAG. 1 (4) | DRR. 4 (15) | — | PGMEA (400) | 9.3 | 0.20 | rectangular |
| E26 | Polym. 1 (80) | PAG. 1 (4) | DRR. 5 (15) | — | PGMEA (400) | 9.4 | 0.20 | rectangular |
| E27 | Polym. 1 (80) | PAG. 1 (4) | DRR. 6 (15) | — | PGMEA (400) | 9.2 | 0.20 | rectanqular |
| E28 | Polym. 1 (80) | PAG. 1 (4) | — | TMMEA (0.1) | PGMEA (400) | 18.0 | 0.20> | rectangular |
| E29 | Polym. 1 (80) | PAG. 1 (4) | — | TMEMEA (0.1) | PGMEA (400) | 16.0 | 0.22 | rectangular |
| E30 | Polym. 1 (80) | PAG. 1 (4) | — | triethanolamine (0.1) | PGMEA (600) | 20.0 | 0.20> | rectangular |
| E31 | Polym. 1 (80) | PAG. 1 (4) | — | N-methylpyrrolidone (0.05) | PGMEA (600) | 12.0 | 0.22 | rectangular |
| E32 | Polym. 1 (80) | PAG. 1 (4) | DRR. 1 (15) | quinoline (0.05) | PGMEA (600) | 13.1 | 0.22 | rectanqular |
| E33 | Polym. 1 (80) | PAG. 1 (4) | — | triethanolamine (0.1) piperidine ethanol | PGMEA (600) | 22.5 | 0.20> | rectangular |

TABLE 3-continued

| | Resist composition (pbw in parentheses) | | | | Sensitivity | | |
| --- | --- | --- | --- | --- | --- | --- | --- |
| No. | Base resin | Photoacid generator | Dissolution regulator | Basic compound | Organic solvent | Eth (mJ/cm$^2$) | Resolution ($\mu$m) | Profile |
| E34 | Polym. 1 (80) | PAG. 1 (2) | — | (0.05) tributylamine (0.1) | PGMEA (600) | 19.5 | 0.20 | rectangular |
| E35 | Polym. 1 (50) Polym. 15 (30) | PAG. 1 (4) | — | — | PGMEA (600) | 9.2 | 0.22 | rectangular |

TMMEA: tris{2-(2-methoxymethoxy)ethyl}amine
TMEMEA: tris[2-{(2-methoxyethoxy)methoxy}ethyl]amine

TABLE 4

| | Resist composition (pbw in parentheses) | | | | Sensitivity | | |
| --- | --- | --- | --- | --- | --- | --- | --- |
| No. | Base resin | Photoacid generator | Dissolution regulator | Basic compound | Organic solvent | Eth (mJ/cm$^2$) | Resolution ($\mu$m) | Profile |
| CE1 | Polym. 14 (80) | PAG. 1 (4) | — | — | PGMEA (400) | 9.1 | 0.22 | rectangular |
| CE2 | Polym. 14 (80) | PAG. 1 (4) | — | N-methylpyrrolidone (0.01) | PGMEA (400) | 12.0 | 0.24 | round head |
| CE3 | Polym. 15 (80) | PAG. 1 (4) | — | — | DGLM (400) | 9.3 | 0.22 | rectangular |

It is evident from Tables 2 to 4 that chemically amplified resist compositions of the invention form resist patterns having a high resolution and a minimized edge roughness.

Example 36

A silicon wafer was coated with a lower resist film of 2.0 $\mu$m thick using OFPR 800 (Tokyo Oka K.K.), and the film was cured by heating at 200° C. for 5 minutes. As in Example 1, the resist solution prepared above was coated onto the lower resist film to a thickness of about 0.35 $\mu$m and pre-baked. The resist film was then exposed to a KrF excimer laser beam and developed, forming a pattern of the lower resist film. All the resist solutions could form a pattern having perpendicular side walls on the lower resist film without footing.

Using a parallel plate type sputter etching apparatus, the resist was etched with oxygen gas as an etchant gas. The etching conditions are shown below.

Gas flow rate: 50 SCCM

Gas pressure: 1.3 Pa

RF power: 50 watts

DC bias: 450 volts

The lower resist film was etched at a rate of 150 nm/min. while the upper resist film of the inventive composition was etched at a rate of less than 3 nm/min. After 15 minutes of etching, those portions of the lower resist film which were not covered with the upper resist film were completely eliminated, leaving a two-layer resist pattern having a thickness of more than 2 $\mu$m.

Japanese Patent Application No. 72702/1997 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A high molecular weight silicone compound having phenolic hydroxyl groups, wherein the hydrogen atoms of some of the phenolic hydroxyl groups are replaced by acid labile groups of at least one type, said silicone compound is crosslinked at some of the remaining phenolic hydroxyl groups with crosslinking groups having C—O—C linkages within a molecule and/or between molecules, and said silicone compound has a weight average molecular weight of 5,000 to 50,000.

2. The high molecular weight silicone compound of claim 1 comprising recurring units of the following general formula (1), wherein the hydrogen atoms of some of the phenolic hydroxyl groups are replaced by acid labile groups, the silicone compound is crosslinked within a molecule and/or between molecules with crosslinking groups having C—O—C linkages resulting from reaction between some of the remaining phenolic hydroxyl groups and an alkenyl ether compound or halogenated alkyl ether compound, and the amount of said acid labile groups and said crosslinking groups combined is on the average more than 0 mol % to 80 mol % of the entire hydrogen atoms of phenolic hydroxyl groups,

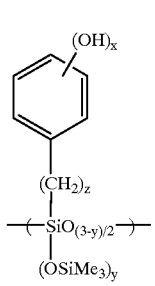

(1)

wherein Me is a methyl group, letter x is an integer of 1 to 5, y is a positive number satisfying $0.001 \leq y \leq 0.05$, and z is an integer of 1 to 3.

3. The high molecular weight silicone compound of claim 2 comprising recurring units of the following general formula (2), wherein the silicone compound is crosslinked within a molecule and/or between molecule with crosslinking groups having C—O—C linkages resulting from reaction of the phenolic hydroxyl groups represented by R with an alkenyl ether compound or halogenated alkyl ether compound,

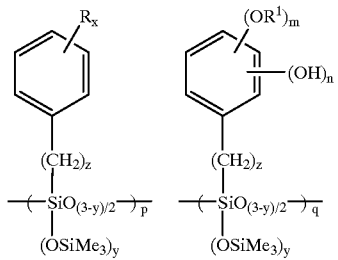
(2)

wherein Me is a methyl group, R is a hydroxyl group or a $OR^1$ group, at least one of the R groups is a hydroxyl group, $R^1$ is an acid labile group, letter m is 0 or an integer of 1 to 5, n is an integer of 1 to 5, satisfying m+n≦5, x is an integer of 1 to 5, y is a positive number satisfying 0.001≦y≦0.05, z is an integer of 1 to 3, p and q are positive numbers, satisfying p+q=1.

4. The high molecular weight silicone compound of claim 3 comprising recurring units of the following general formula (3), wherein some hydrogen atoms are eliminated from the phenolic hydroxyl groups represented by R to leave oxygen atoms which are crosslinked with crosslinking groups having C—O—C linkages of the following general formula (4a) or (4b) within a molecule and/or between molecules,

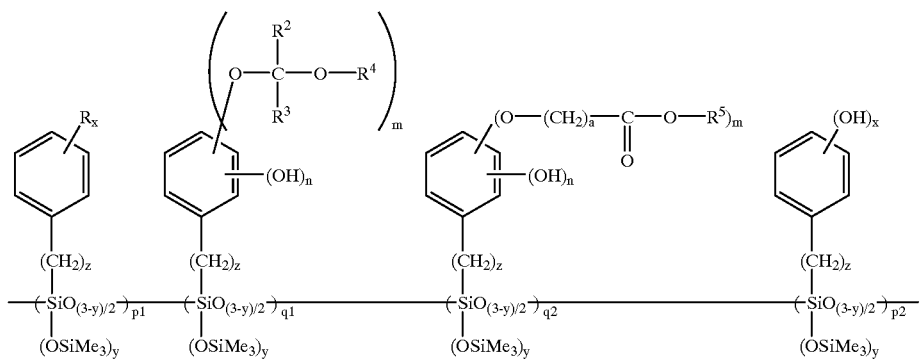
(3)

wherein Me is a methyl group, R is a hydroxyl group or $OR^1$ group, at least one of R groups is a hydroxyl group, $R^1$ is an acid labile group, each of $R^2$ and $R^3$ is hydrogen or a normal, branched or cyclic alkyl group of 1 to 8 carbon atoms, $R^4$ is a monovalent hydrocarbon group of 1 to 18 carbon atoms which may have a hetero atom, or $R^2$ and $R^3$, $R^2$ and $R^4$, or $R^3$ and $R^4$, taken together, may form a ring, with the proviso that each of $R^2$, $R^3$ and $R^4$ is a normal or branched alkylene group of 1 to 18 carbon atoms when they form a ring, $R^5$ is a tertiary alkyl group of 4 to 20 carbon atoms, a trialkylsilyl group whose alkyl groups each have 1 to 6 carbon atoms, an oxoalkyl group of 4 to 20 carbon atoms, or a group —$CR^2R^3OR^4$, letters p1 and p2 are positive numbers, q1 and q2 are 0 or positive numbers, q1 and q2 are not equal to 0 at the same time, satisfying 0<p1/(p1+p2+q1+q2)≦0.8, 0≦q1/(p1+p2+q1+q2)≦0.8, 0≦q2/(p1+p2+q1+q2)≦0.8, and p1+p2+q1+q2=1, a is 0 or an integer of 1 to 6, m, n, x, y, and z are as defined above,

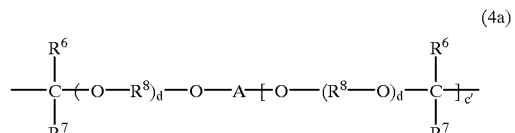
(4a)

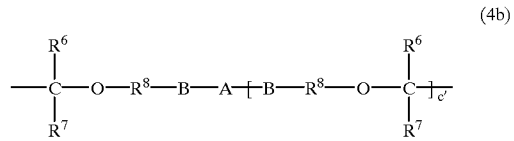
(4b)

wherein each of $R^6$ and $R^7$ is hydrogen or a normal, branched or cyclic alkyl group of 1 to 8 carbon atoms, or $R^6$ and $R^7$, taken together, may form a ring, with the proviso that each of $R^6$ and $R^7$ is a normal or branched alkylene group of 1 to 8 carbon atoms when they form a ring, $R^8$ is a normal, branched or cyclic alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7.

5. The high molecular weight silicone compound of claim 4 wherein the crosslinking group have a C—O—C linkage represented by the general formula (4a) or (4b) is represented by the following general formula (4a') or (4b'):

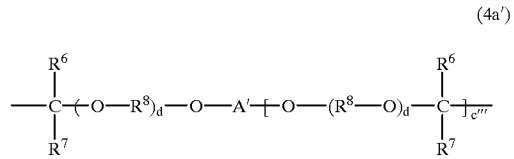
(4a')

-continued

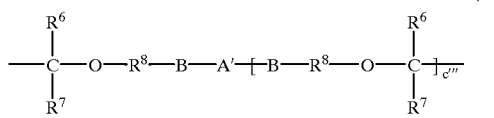
(4b')

wherein each of R⁶ and R⁷ is hydrogen or a normal, branched or cyclic alkyl group of 1 to 8 carbon atoms, or R⁶ and R⁷, taken together, may form a ring, with the proviso that each of R⁶ and R⁷ is a normal or branched alkylene group of 1 to 8 carbon atoms when they form a ring, R⁸ is a normal, branched or cyclic alkylene group of 1 to 10 carbon atoms, letter d is 0 or an integer of 1 to 5, A' is a c"-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—, —NHCO—O— or —NHCONH—, letter c" is an integer of 2 to 4, and c'" is an integer of 1 to 3.

6. A chemically amplified positive resist composition comprising
(A) an organic solvent,
(B) a base resin in the form of the high molecular weight silicone compound of claim 1, and
(C) a photoacid generator.

7. The resist composition of claim 6 further comprising (D) a dissolution regulator.

8. The resist composition of claim 6 further comprising (E) a basic compound.

9. The resist composition of claim 6 further comprising (F) another base resin in the form of a high molecular weight silicone compound comprising recurring units of the following general formula (1), wherein the hydrogen atoms of phenolic hydroxyl groups are replaced by acid labile groups of at least one type in an average proportion of 0 mol % to 80 mol % of the entirety, said silicone compound having a weight average molecular weight of 3,000 to 300,000,

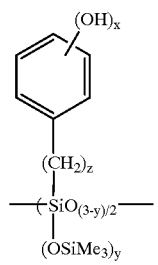
(1)

wherein Me is a methyl group, letter x is an integer of 1 to 5, y is a positive number satisfying 0.001≦y≦0.05, and z is an integer of 1 to 3.

10. A method for forming a resist pattern comprising the steps of:
(i) applying a chemically amplified positive resist composition according to claim 6 onto a substrate,
(ii) heat treating the coated film and then exposing it to actinic radiation having a wavelength of up to 300 nm or electron beams through a photo mask, and
(iii) optionally heat treating the exposed film and developing it with a developer.

11. The high molecular weight silicone compound of claim 1, wherein the at least one type of acid labile group is a tert-alkyl group of 4 to 20 carbon atoms, a trialkylsilyl group wherein the alkyl groups have 1 to 6 carbon atoms, an oxoalkyl group of 4 to 20 carbon atoms of a group of formula (6) or (7):

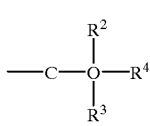
(6)

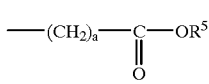
(7)

wherein R² and R³ are each independently hydrogen or a normal, branched or cyclic alkyl group of 1 to 8 carbon atoms; R⁴ is a monovalent hydrocarbon group of 1 to 18 carbon atoms which optionally contains a heteroatom; alternatively, any two of R², R³ and R⁴ together form a ring of a normal or branched alkylene groups of 1 to 18 carbon atoms; R⁵ is a tertiary alkyl group of 4 to 20 carbon atoms, a trialkylsilyl group wherein the alkyl groups have 1 to 6 carbon atoms, or a group of formula (6); and letter a is 0 or a positive integer of 1 to 6.

12. The high molecular weight silicone compound of claim 1, wherein the amount of acid labile groups and crosslinking groups combined is on the average from 2 to 50 mol % of the entire hydrogen atoms of phenolic hydroxyl groups in the silicone compound.

13. The high molecular weight silicone compound of claim 2, wherein the amount of acid labile groups and crosslinking groups combined is on the average from 2 to 50 mol % of the entire hydrogen atoms of phenolic hydroxyl groups in the silicone compound having recurring units of the formula (1).

14. The high molecular weight silicone compound of claim 1, wherein the amount of crosslinking groups is on the average from 0.2 to 20 mol % of the entire hydrogen atoms of phenolic hydroxyl groups in the silicone compound and the amount of acid labile groups is on the average from 10 to 50 mol % of the entire hydrogen atoms of phenolic hydroxyl groups in the silicone compound.

15. The high molecular weight silicone compound of claim 2, wherein the amount of crosslinking groups is on the average from 0.2 to 20 mol % of the entire hydrogen atoms of phenolic hydroxyl groups in the silicone compound and the amount of acid labile groups is on the average from 10 to 50 mol % of the entire hydrogen atoms of phenolic hydroxyl groups in the silicone compound having recurring units of the formula (1).

16. The high molecular weight silicone compound of claim 1, wherein the silicone compound has a weight average molecular weight of from 5,000 to 10,000.

17. The high molecular weight silicone compound of claim 2, wherein the silicone compound has a weight average molecular weight of from 5,000 to 10,000.

* * * * *